000000000000000000000000000

United States Patent
Curry et al.

(10) Patent No.: US 6,379,157 B1
(45) Date of Patent: Apr. 30, 2002

(54) COMMUNICATION CONNECTOR WITH INDUCTIVE COMPENSATION

(75) Inventors: Cliff R. Curry, Seattle; John M. Redfield, Brier, both of WA (US)

(73) Assignee: Leviton Manufacturing Co., Inc., Littleneck, NY (US)

( * ) Notice: Subject to any disclaimer, the term of this patent is extended or adjusted under 35 U.S.C. 154(b) by 0 days.

(21) Appl. No.: 09/642,114

(22) Filed: Aug. 18, 2000

(51) Int. Cl.$^7$ ................................................ H01R 24/00
(52) U.S. Cl. ........................................ 437/676; 439/941
(58) Field of Search ................................ 439/676, 188, 439/638, 654, 521, 334, 135, 736, 941, 660, 76.1, 751; 174/32–34; 333/12.11, 5; 379/417

(56) References Cited

U.S. PATENT DOCUMENTS

| | | | |
|---|---|---|---|
| 5,299,956 A | | 4/1994 | Brownell et al. ............ 439/638 |
| 5,414,393 A | * | 5/1995 | Rose et al. .................. 439/676 |
| 5,924,896 A | * | 7/1999 | Arnett et al. ................ 439/676 |
| 5,997,358 A | | 12/1999 | Adriaenssens et al. ...... 439/676 |
| 6,007,368 A | | 12/1999 | Lorenz et al. .............. 439/418 |
| 6,079,996 A | | 6/2000 | Arnett ......................... 439/188 |
| 6,089,923 A | * | 7/2000 | Phommachnh ............... 439/676 |
| 6,113,432 A | * | 9/2000 | Liao ........................... 439/638 |
| 6,171,152 B1 | * | 1/2001 | Kunz .......................... 439/620 |
| 6,196,880 B1 | * | 3/2001 | Goodrich et al. ............ 439/676 |

* cited by examiner

Primary Examiner—Neil Abrams
Assistant Examiner—J. F. Duverne
(74) Attorney, Agent, or Firm—Seed Intellectual Property Law Group PLLC

(57) ABSTRACT

A compensating jack connector includes a printed circuit (PC) board with wire trace layers for reducing unwanted crosstalk originating in wire pairs including those found within a conventional communication plug coupled to the compensating jack connector. Some embodiments of the PC board of the compensating jack connector include layers having inter-digitated capacitance to form compensative capacitive coupling and multi-point compensative coupling and inductance to form inductive coupling to reduce the unwanted crosstalk. Pairs of wire traces are so oriented in some of the PC board layers to couple inductance between one pair of wire traces with inductance between another pair of wire traces to contribute in reduction of unwanted crosstalk. Some embodiments of multi-point compensative coupling position inter-digitated capacitance at different time delay distances from origination points of unwanted crosstalk and having different polarities to contribute in reduction of unwanted crosstalk. Other embodiments of the PC board have layers that include other capacitive coupling having a single time delay distance from a source of unwanted crosstalk. Further embodiments of the PC board of the compensating jack connector include layers having combinations of the inductive compensative coupling, multi-point compensative coupling, and the other capacitive coupling.

25 Claims, 21 Drawing Sheets

LAMINATION SEQUENCE

COMMUNICATION CONNECTOR WITH INDUCTIVE COMPENSATION

TECHNICAL FIELD

The present invention is directed to communication connectors, and, more specifically, to a communication connector with improved crosstalk reduction using compensation including inductive compensation.

BACKGROUND OF THE INVENTION

The widespread use of communication devices has also spurred the development of communication connectors. Initially, communication devices such as telephones, computer terminals, and the like were hardwired. For example, the wire cable for a telephone was coupled directly through a hole in a wall plate to electrical terminals.

Modern telephone connectors use an industry standard receptacle mounted in the wall and a mating industry standard plug at the end of a telephone cord. The use of industry standard connectors permits the convenient installation of telephones. Similarly, industry standard connectors have been developed for other communication devices such as computers. For example, a personal computer may be coupled to a local area network (LAN) via a communication connector similar to those used with telephones.

The use of communication connectors with telephones does not result in the degradation of signal quality because telephones typically have limited bandwidth. However, high-speed communication devices, such as computers, can suffer significant degradation of signal quality as a result of communication connectors. Therefore, it can be appreciated that there is a significant need for a communication connector that minimizes degradation of signal quality. The present invention offers this and other advantages as will be apparent from the following detailed description and accompanying figures.

SUMMARY OF THE INVENTION

The present invention is directed to a communication connector with inductive compensation. Aspects of the compensating connector include a body having a first body portion and a second body portion. The first body portion is configured to engage the compensating jack connector with the plug connector. A plurality of contact members is positioned toward the first body portion. The contact members are configured to electrically couple with the plug connector elements when the compensating jack connector is engaged with the plug connector. A plurality of wire connectors is positioned toward the second body portion. The wire connectors are configured to electrically couple to the second set of external conductors.

Further aspects include a structure with first and second surfaces. A plurality of internal conductors include first, second, third, and fourth conductors. At least part of the first and second conductors is adjacent to the first surface and at least part of the third and fourth conductors are adjacent to the second surface. Each of the plurality of internal conductors is electrically coupled to one of the plurality of contact members and each of the plurality of internal conductors extends toward one of the plurality of wire connectors.

Additional aspects include each of the plurality of internal conductors being electrically coupled to one of the plurality of wire connectors. A first portion of the first conductor and a first portion of the second conductor are spaced apart from a first centerline. A first portion of the third conductor and a first portion of the fourth conductor are spaced apart from a second centerline. The first centerline and the second centerline are in alignment with one another whereby inductive coupling occurs when communication signals are applied to the first, second, third, and fourth conductors.

Other features and advantages of the invention will become apparent from the following detailed description, taken in conjunction with the accompanying drawings.

DETAILED DESCRIPTION OF THE INVENTION

Figure 1A:
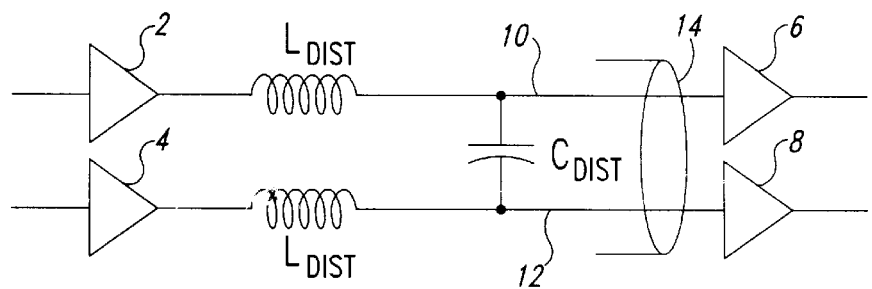
FIG. 1A is a schematic diagram illustrating a conventional communication transmission system.

Communication connectors offer easy and reliable connections for a variety of communication devices. A conventional communication transmission system is illustrated in the schematic diagram of FIG. 1A. The transmission system includes line drivers 2 and 4 and corresponding line receivers 6 and 8. A wire conductor 10 connects the line driver 2 to the line receiver 6. A wire conductor 12 connects the line driver 4 to the line receiver 8. FIG. 1A illustrates the wire conductors 10 and 12 as single conductors, which are typically bundled together as portions of a cable 14. The wire conductors 10 and 12 are thus twisted in a parallel fashion to each other for the length of the cable 14. A capacitance $C_{DIST}$ and inductance $L_{DIST}$ are shown in FIG. 1A to model a distributed capacitive and inductive coupling between the wire conductors 10 and 12. A mutual inductance between the two inductances $L_{DIST}$ and the capacitance $C_{DIST}$ contributes to the coupling of electrical signals between the wire conductors 10 and 12. The signal that is coupled capacitively or inductively between conductors is an undesirable signal that may be termed a "leakage" signal or "crosstalk." At low frequencies, such as are typical in a telephone, the crosstalk between the wire conductors 10 and 12, respectively, is minimal because the distributed capacitance $C_{DIST}$ and inductance $L_{DIST}$ provide low coupling at such low frequencies. However, at higher frequencies, the crosstalk between the wire conductors 10 and 12 becomes significant.

Figure 1B:
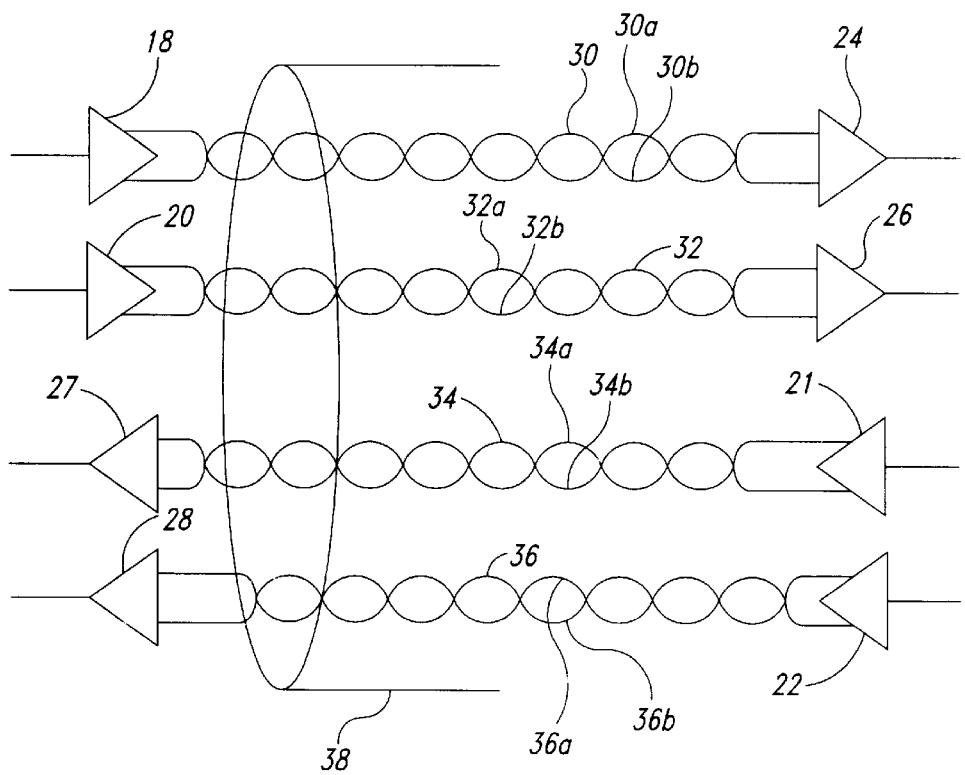
FIG. 1B is a schematic diagram illustrating a conventional technique for transmission of communication signals using differential circuitry and a twisted pair wire cable.

To minimize crosstalk, designers often use twisted pair cables and differential amplifiers, such as illustrated in FIG. 1B. FIG. 1B includes differential line drivers 18, 20, 21 and 22, which are coupled to differential line receivers 24, 26, 27 and 28, respectively. The differential line driver 18 is coupled to the differential line receiver 24 by a twisted pair cable 30 having a "tip" wire 30a and a "ring" wire 30b. Similarly, a twisted pair cable 32, having a "tip" wire 32a and a "ring" wire 32b, couples the differential line driver 20 to the differential line receiver 26, a twisted pair cable 34 having a "tip" wire 34a and a "ring" wire 34b couples the differential line driver 21 to the differential line receiver 27, and a twisted pair cable 36 having a "tip" wire 36a and a "ring" wire 36b couples the differential line driver 22 to the differential line receiver 28. The twisted pair cables 30–36 are typically portions of a cable 38. Each of the twisted pair cables 30–36 may be individually shielded to provide additional protection from crosstalk.

As is known in the art, the differential line receivers 24–28 are designed to reject signals that are present on both conductors of their respective twisted pair cables 30–36.

The degree to which the differential line receivers 24–28 can reject these "common mode" signals is indicated by a common mode rejection ratio (CMRR). The system illustrated in FIG. 1B is an improvement over that illustrated in FIG. 1A because crosstalk between the twisted pair cables is canceled out by the CMRR of the differential line receivers. For example, a signal transmitted over the twisted pair cable 34 may be capacitively and inductively coupled to the twisted pair cable 30. However, the capacitive coupling between the "tip" wire 34a and the "ring" wire 34b associated with the twisted pair cable 34 is substantially equal to the capacitive coupling associated with the "tip" wire 30a and the "ring" wire 30b of the twisted pair cable 30. The common mode rejection of the differential line receiver 24 effectively cancels the common mode crosstalk signal. Thus, the twisted pair conductors permit the transmission of data at a significantly higher bandwidth while reducing crosstalk to an acceptable level.

Figure 2A:
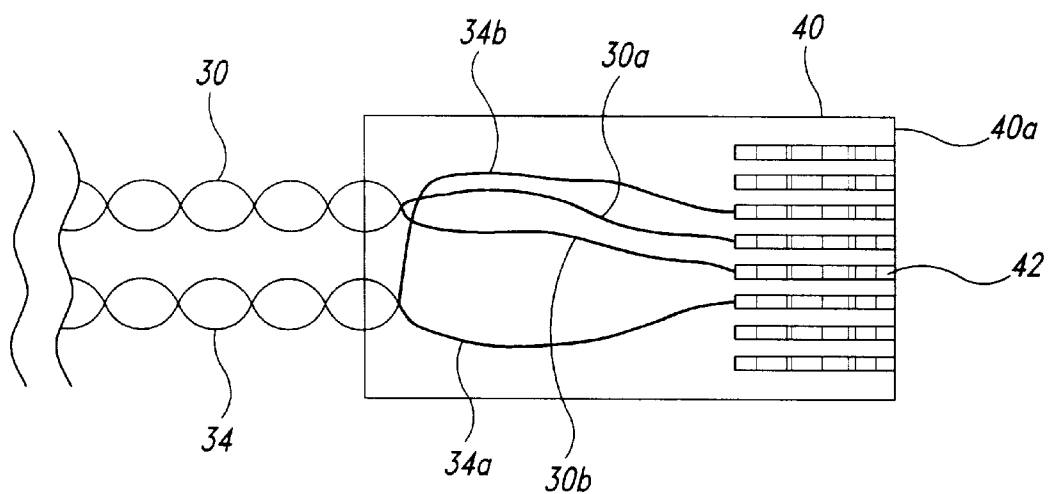
FIG. 2A is a schematic diagram of a conventional communication plug connector for use with the twisted pair wire cable of FIG. 1B.
Figure 2B:
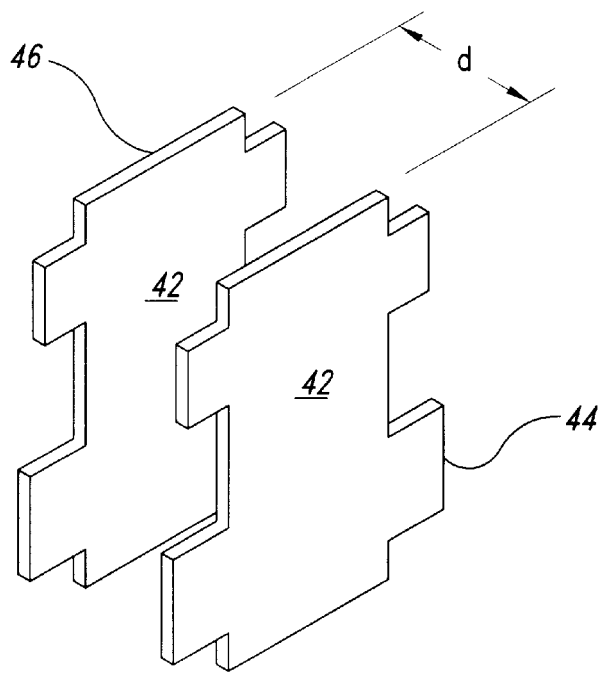
FIG. 2B is a perspective view of plug connector elements of the conventional communication plug connector of FIG. 2A.
Figure 2C:
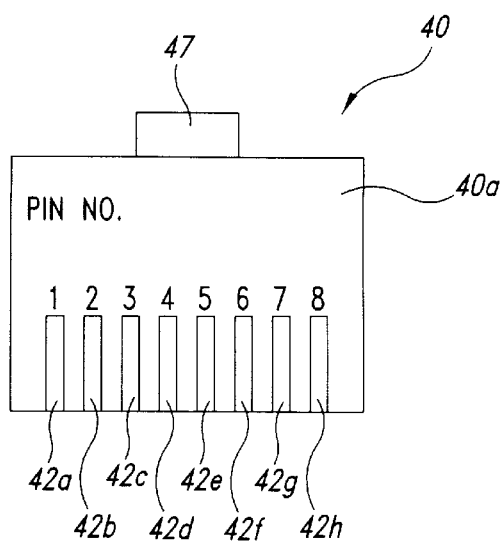
FIG. 2C is a front schematic view of the conventional communication plug connector of FIG. 2B showing pin assignment and configuration of the plug connector elements.
Figure 2D:
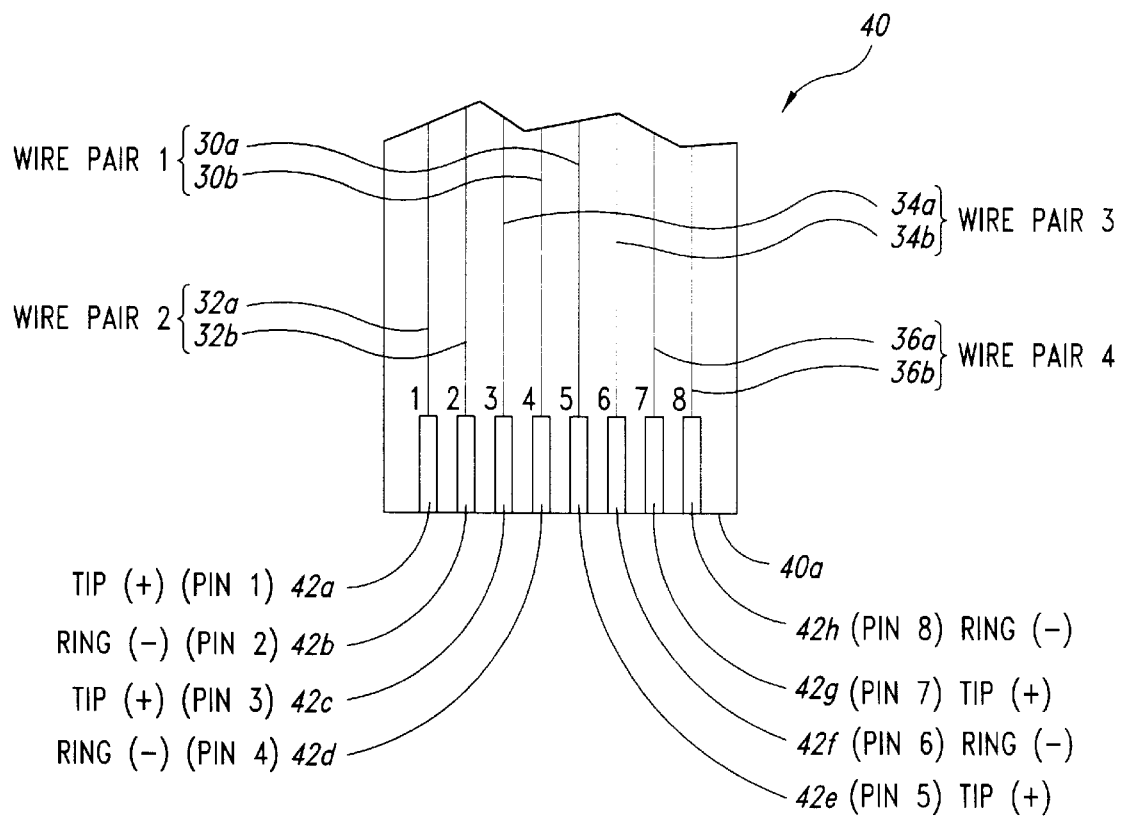
FIG. 2D is a top schematic sectional view of the conventional communication plug connector of FIG. 2B showing the wire pairs associated with the plug connector elements of FIG. 2C.
Figure 2E:
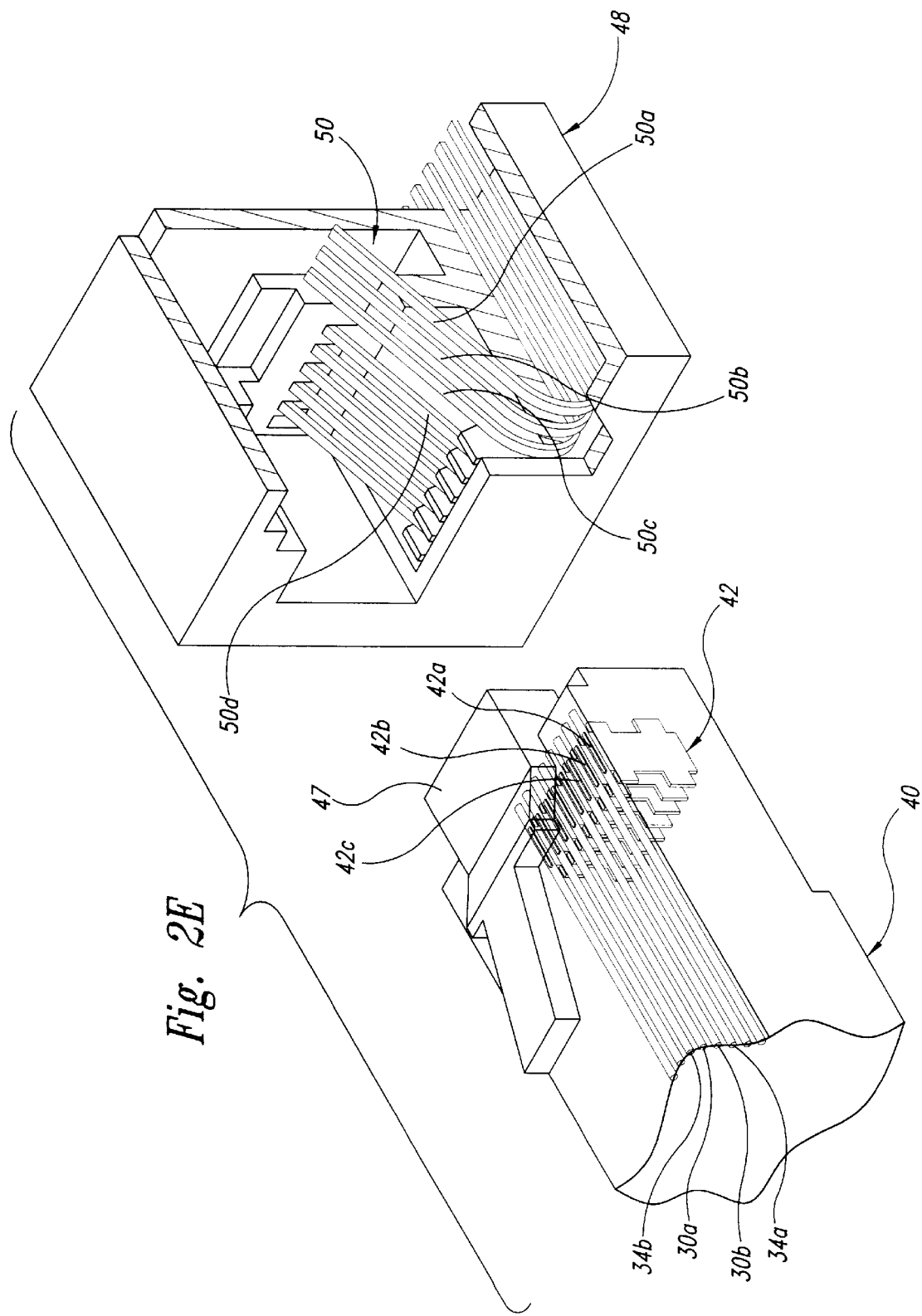
FIG. 2E is an isometric sectional view of the conventional communication plug connector and associated conventional mating communication jack connector.

The twisted pair conductors are typically terminated in a conventional communication plug adapter 40, as illustrated in FIGS. 2A and 2C or a conventional communication jack adapter 48, as illustrated in FIG. 2E. FIG. 2A illustrates an industry standard RJ45 plug, which accommodates four sets of twisted pair cables (i.e., 8 wires). For the sake of simplicity, FIG. 2A only illustrates the connection of the innermost positioned twisted pair cables 30 and 34. The communication plug connector 40 couples with the conventional compatible mating communication jack connector 48 (shown in FIG. 2E) having contact members 50 in a manner well known in the art.

The communication plug connector 40 includes a plurality of metal contact or plug connector elements 42, as best shown in FIGS. 2B and 2E, to electrically connect the wire conductors of the twisted pair cables 30 and 34 to the mating conventional communication jack connector 48. The plug connector elements 42 may be plates, resilient wires or take other conventional forms. The twisted pair cable 30 comprises two individual wires occupying center positions within the communication plug connector 40, with the center "tip" wire 30a and the center "ring" wire 30b being untwisted within the communication plug connector 40 to permit their electrical connection to two corresponding plug connector elements 42. Similarly, the twisted pair cable 34 comprises the two individual wires occupying a split position within the communication plug connector 40, with the split "tip" wire 34a and the split "ring" wire 34b also being untwisted within the communication plug connector 40 to permit their electrical connection to two corresponding plug connector elements 42. With the industry standard RJ45 plug, the center "tip" wire 30a and the center "ring" wire 30b of the twisted pair cable 30 are coupled to the innermost pair of the plug connector elements 42 of the communication plug connector 40. The split "tip" wire 34a of the twisted pair cable 34 is coupled to the plug connector element 42 on one side of the center "tip" wire 30a and the center "ring" wire 30b, while the split "ring" wire 34b is coupled to the plug connector element 42 on the opposite side of the center "tip" wire 30a and the center "ring" wire 30b. In this configuration, the untwisted center "tip" wire 30a and the center "ring" wire 30b of the twisted pair cable 30 run inside and generally along side to the untwisted split "tip" wire 34a and the split "ring" wire 34b of the twisted pair cable 34, as illustrated in FIG. 2A. As shown, the plug connector elements 42 are exposed along a front face 40a of the communication plug connector 40 for electrical coupling using a tab 47 to secure engagement with the communication jack connector 48.

Because portions of the twisted pair cables 30 and 34 are untwisted within the communication plug connector 40, the individual center "tip" wire 30a and the center "ring" wire 30b may be differentially exposed to crosstalk from untwisted wires of the twisted pair cable 34 as well as the untwisted wires of the twisted pair cables 32 and 36 (not illustrated in FIG. 2A). That is, the crosstalk from the twisted pair cables 32, 34, and 36 may not occur equally in the individual center "tip" wire 30*a* and the center "ring" wire 30*b* in the portion of the twisted pair cable 30 that is untwisted. An industry testing standard, designated as TIA 568A, utilizes an RJ45 plug as a standard plug while testing hardware including category 5, category 5*e*, and category 6 communication systems. A worst case crosstalk condition for crosstalk on an RJ45 plug occurs between the twisted pair cable 30 and the twisted pair cable 34 illustrated in FIG. 2A. The untwisted center "tip" wire 30*a* and the center "ring" wire 30*b* are coupled to the innermost plug connector elements 42 of the communication plug connector 40 while the untwisted split "tip" wire 34*a* and the split "ring" wire 34*b* are separated and coupled to the plug connector elements 42 on opposite outer sides of the innermost plug connector elements 42 such that the center "tip" wire 30*a* and the center "ring" wire 30*b* are located intermediate the split "tip" wire 34*a* and the split "ring" wire 34*b*. Measurements of this worst case condition have indicated that the crosstalk between the individual wires of the twisted pair cables 30 and 34 while in an untwisted state result in a signal-to-crosstalk level of approximately 40 decibels (dB) at 100 megahertz (MHz). Under these circumstances, the differential signal caused by the leakage is significant and cannot be canceled by a differential line receiver. While other wires within the RJ45 plug have a different signal-to-crosstalk level ratio, there is still an appreciable differential signal caused by leakage among the various wire conductors in the untwisted portion within the communication plug connector 40.

Crosstalk in the conventional communication plug connector 40 is also caused by the physical construction of the plug connector elements 42 and the materials used in the construction of the communication connector. FIG. 2B illustrates a pair of the plug connector elements 42, each having a solid metal plate with a contact surface 44 and a terminal surface 46. The contact surface 44 is used to couple the connector elements 42 to the wire cable while the terminating surface 46 is used to couple the connector elements to the mating connector. The industry standard RJ45 plug contains eight plug connector elements 42. However, for the sake of simplicity, FIG. 2B illustrates only two plug connector elements 42. This construction of the plug connector elements 42 adds to the crosstalk experienced, as will be explained below.

The plug connector elements 42 are mounted within the communication plug connector 40 and are arranged parallel to each other and spaced apart at a distance d. Each of the plug connector elements 42 acts much as a plate in a parallel plate capacitor. As is known to those of ordinary skill in the art, the capacitance formed between the plug connector elements 42 is directly proportional to the surface area of the plug connector elements and is inversely proportional to the square of the distance d separating the plug connector elements.

The conventional communication plug connector 40 is molded from a polycarbonate material, which acts as a dielectric constant. Each of the plug connector elements 42 is embedded in the polycarbonate material when the communication plug connector 40 is manufactured. The capacitance between the plug connector elements 42 is increased through the use of this dielectric material between the connector elements. Therefore, the capacitance between the individual plug connector elements 42 is increased by virtue of the parallel surface areas of the plug connector elements and the high dielectric constant value of the polycarbonate material between them. Thus, while the communication plug connector 40 provides a simple and inexpensive connection method, it results in decreased performance due to crosstalk between the conductors within the body of the communication plug connector and the capacitance coupling between the plug connector elements themselves.

The communication plug connector 40 is shown in FIGS. 2C and 2D as having plug connector elements 42*a*–42*h*. As shown from a view of a front face 40*a* of the communication plug connector 40 in FIG. 2C, the plug connector elements 42*a*–42*h* are arranged according to a pin number 1 through 8, respectively. As discussed, the plug connector elements 42*a*–42*h* are wired to the "tip" wires and the "ring" wires of the twisted pair cables 30–36. As shown in FIG. 2D, the center "tip" and "ring" wires 30*a* and 30*b*, designated as wire pair 1, are electrically connected to the pin 5 and pin 4 plug connector elements 42*e* and 42*d*, respectively. The pin 1 and pin 2 plug connector elements 42*a* and 42*b* are electrically connected to left outside "tip" and "ring" wires 32*a* and 32*b*, respectively, designated as wire pair 2. The pin 3 and pin 6 plug connector elements 42*c* and 42*f* are electrically connected to the split "tip" and "ring" wires 34*a* and 34*b*, respectively, designated as wire pair 3. The pin 7 and pin 8 plug connector elements 42*g* and 42*h* are electrically connected to the right outside "tip" and "ring" wires 36*a* and 36*b*, respectively, designated as wire pair 4.

The conventional communication jack connector 48 is also likely to introduce crosstalk as well. Its contact members 50, as best illustrated by the four contact members 50*a*–50*d*, are configured in a parallel arrangement as shown in FIG. 2E and allow crosstalk to occur between the contact members in a manner similar to that described above. The contact members 50 of the conventional communication jack connector 48 are so positioned and shaped to electrically couple to the terminal surfaces 46 of the plug connector elements 42 of the conventional communication plug connector 40.

Figure 3:
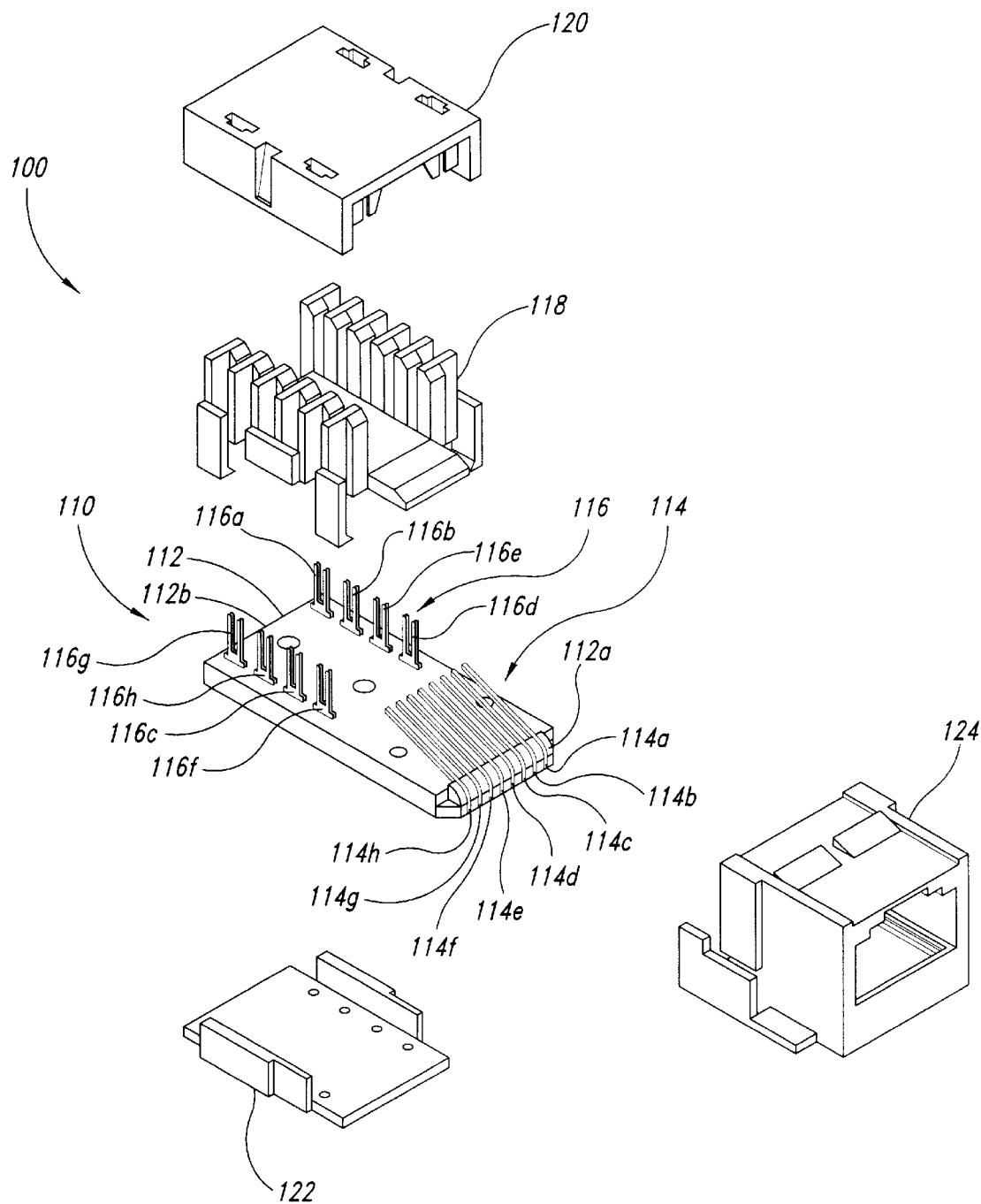
FIG. 3 is an exploded isometric view of a compensating communication jack connector of the present invention.

The present invention is directed to an improvement in communication jack connectors that compensates for unwanted crosstalk such as that produced in communication plug connectors, such as in the communication plug connector 40 described above. The present invention, illustrated in the exemplary embodiment of FIG. 3, includes a compensating communication jack connector 100 with an external configuration that conforms to an industry standard communication jack connector. In the exemplary embodiment of FIG. 3, the compensating jack connector 100 conforms to the industry standard specifications for an RJ45 jack as controlled by the Federal Communications Commission under Title 47, Part 68. Performance of the exemplary embodiment of the compensating communication jack connector 100 is also to conform to Telephone Industries Association Category 5 enhanced standards. However, as will be discussed below, the principles of the present invention are applicable to other communication connectors including those that conform to category 6 standards. The industry standard external configuration allows the compensating jack connector 100 to readily connect with an industry standard version of the plug connector 40, such as shown in FIG. 2E. While described as a communication jack connector, it is noted that the compensating jack connector 100 of the present invention may take the form of a plug or a receptacle, or any other style connector to physically mate with and compensate for a corresponding communication connector prone to produce crosstalk.

The compensating jack connector 100 includes a circuit assembly 110 having an external layer 112 of a printed circuit board 126 with a front side 112a and a back side 112b, contact members 114 identified by 114a–114h and wire connectors 116 identified by 116a–116h. The compensating jack connector 100 further includes a connector stay 118, an upper cover 120, a lower cover 122, and a front cover 124.

Both the contact members 114a–114h and the wire connectors 116a–116h are structurally engaged with the external layer 112. The printed circuit (PC) board 126 (see also FIG. 5) electrically couples each one of the contact members 114a–114h with corresponding ones of the wire connectors 116a–116h, respectively, and will be explained in further detail below. The contact members 114a–114h of the compensating jack connector 100 are similar to the contact members 50 of the conventional communication jack connector 48 allowing for compatibility with conventional designs of the plug connector 40. The contact members 114a–114h conform with conventional terminology of "pin 1" through "pin 8," respectively. The wire connectors 116 are designed to each fixedly engage with a wire that typically is coupled to a communication device or communication transmission system. The connector stay 118 is shaped to provide structural stability for the wire connectors 116. The connector stay 118, the lower cover 122, and the front cover 124 connect together to form a housing for the circuit assembly 110. The upper cover 120 is used for dust protection.

The compensating jack connector 100 is configured to compensate for crosstalk originating in the conventional communication plug connector 40, which is sometimes referred to as near-end crosstalk. Some embodiments of the compensating jack connector 100 are also configured to compensate for crosstalk originating in communication cables and circuits (such originating in other communication plug connectors) that are electrically coupled to the compensating jack connector 100 through the communication plug connector 40, which is sometimes referred to as far-end crosstalk.

Twisted pair signaling uses pairs of wires with a first wire of the pair designated as "tip" and the second wire of the pair designated as "ring." The voltage and currents found on each "tip" wire and each "ring" wire of a pair are of opposite polarity where the "tip" wire of a "tip"-"ring" pair of wires is at a positive voltage relative to the "ring" wire of the pair. These opposite polarity aspects of twisted pair signaling are used by the describe embodiments of the present invention to reduce crosstalk. In particular, to compensate for crosstalk caused by a first capacitive coupling between two wires or a first inductive coupling between two pairs of wires at a first location, a second capacitive coupling between the two wires or a second inductive coupling between the two pairs of wires can be purposefully added at a second location to produce crosstalk having a magnitude opposite to the crosstalk found at the first location. Since the first coupling and the second coupling result in crosstalk with opposite polarity, the crosstalk associated with the first coupling and the crosstalk associated with the second coupling tend to cancel each other resulting in substantially reduced levels of crosstalk. Thus, to compensate for a first crosstalk originating in the communication plug connector 40, a second crosstalk could be introduced at the compensating communication jack 100 of an equal amount and with an opposite sign with respect to the first crosstalk.

According to the terminology used herein, capacitive coupling between two wires of the same polarity, such as between two "tip" wires or between two "ring" wires, is referred to as positive capacitive coupling, whereas capacitive coupling between two wires of opposite polarity, such as between a "tip" wire and a "ring" wire, is referred to as negative capacitive coupling. Also, according to the terminology used herein inductive coupling can be referred to as either positive inductive coupling or negative inductive coupling. Two parallel "tip" and "ring" wires can be analytically treated as a current loop, which has an associated magnetic field. Initial analysis focuses on pair 1 through 4 of the "tip" wires 30a–36a and "ring" wires 30b–36b as primary current loops. As connected in the communication plug connector 40, wire pair 1 of the center "tip" wire 30a and the center "ring" wire 30b is inside of wire pair 3 of the split "tip" wire 34a and the split "ring" wire 34b so that the current loop associated with wire pair 1 is inside the current loop associated with wire pair 3.

Consequently, a magnetic field associated with wire pair 1 shares space and interacts with a magnetic field associated with wire pair 3 resulting in an inductive coupling, but the magnetic field of the first wire pair and the magnetic field of the second wire pair are in opposite directions since the pin order of the "tip" and "ring" wires of wire pair 1 and wire pair 3 are reversed. Wire pair 1 has the center "ring" wire 30b connected to the plug connector element 42d as pin 4 and then the center "tip" wire 30a connected to the plug connector element 42e as pin 5, whereas wire pair 3 has the split "tip" wire 34a connected to the plug connector element 42c as pin 3 and the split "ring" wire 34b connected to the plug connector element 42f as pin 6. When two wire pairs are oriented with one another such that their respective magnetic fields share space, but are in opposite directions, the resultant inductive coupling is referred to as being negative. Conversely, if the magnetic fields of two wire pairs share space and are in the same direction, the resultant inductive coupling is referred to as being positive. Representative measurements of inductive and capacitive coupling of the conventional communication plug connector 40 are found in Table 1 below. Shown in the table are indications of the polarity of the coupling as (+) for positive coupling and (–) for negative coupling. The pair and pin numbers correspond to descriptions of the conventional communication plug connector 40, in particular, with respect to FIG. 2D.

TABLE 1

| Pair Nos. | Pin Nos. | Capacitance (FemtoFarads) | Inductance (NanoHenries) |
| --- | --- | --- | --- |
| 1, 2 | 4,5 & 1,2 | Negligible | (+) 0.4 |
| 1, 3 | 4,5 & 3,6 | (–) 200 | (–) 3 |
| 1, 4 | 4,5 & 7,8 | Negligible | (+) 0.4 |
| 2, 3 | 1,2 & 3,6 | (–) 100 | (–) 1 |
| 2, 4 | 1,2 & 7,8 | Negligible | Negligible |
| 3, 4 | 3,6 & 7,8 | (–) 100 | (–) 1 |

Some conventional jack designs use capacitive coupling of a polarity opposite to the polarity of unwanted coupling found in the conventional communication plug connector 40 to deliberately introduce crosstalk having polarity opposite to the polarity of the unwanted crosstalk originating in the conventional communication plug connector. Although, capacitive coupling for crosstalk occurs between two individual wires, whereas inductive coupling for crosstalk occurs between two pairs of wires, capacitive coupling is often referred to as being associated with two pairs of wires. Following this convention, capacitive coupling of the conventional communication plug connector 40 would be associated with two wire pairs. For instance, the conventional communication plug 40 may be referred to as having capacitive coupling associated with the pair of the center "tip" and "ring" wires 30a and 30b (pair 1—pins 4 and 5) and the pair of the left outside "tip" and "ring" wires 32a and 32b (pair 2—pins 1 and 2) of a certain magnitude with a positive polarity. For this example, a conventional approach would be to add capacitance in the conventional communication jack connector 48 to be electrically coupled between a "tip" wire of one of the pairs and a "ring" wire of the other of the pairs to introduce capacitive coupling with a negative polarity to compensate for the unwanted capacitive coupling of a positive polarity associated with the pair 1–pair 2 combination.

Capacitance produced with parallel plates and capacitance produced by closely spaced lengths of wire are conventional methods used to achieve capacitive coupling opposite in sign of and to compensate for unwanted capacitive coupling. Capacitive coupling has also been used conventionally in multiple jack outlets so that under certain conditions crosstalk in one jack outlet reduces crosstalk of an opposite sign in another jack outlet. Absent from conventional jack designs, however, is the use of added inductive coupling between multiple "tip-ring" wire pairs to reduce and eliminate unwanted crosstalk. Also absent from conventional jack designs is the use of multi-point compensative coupling using added capacitive coupling or inductive coupling of both polarities in various internal jack locations having substantially different distances, such as from the front side 112a of the external layer 112 of the PC board 126 of the compensating jack connector 100, to address such issues as delays in signal travel through the conventional communication plug connector 40 and the compensating jack connector 100 to better eliminate unwanted crosstalk.

In some embodiments, the compensating jack connector 100 uses inductive coupling between pairs of wires to add crosstalk to cancel out unwanted crosstalk. Inductive coupling can also be used in the compensating jack connector along with conventional capacitive coupling having polarity opposite to the polarity of the unwanted coupling found in the conventional communication plug connector 40. In other embodiments, the compensating jack connector 100 uses multi-point compensative coupling by adding in more than one location capacitive coupling having polarities of signs, both the same sign and opposite to the sign of the polarity of the unwanted coupling, for reduction of unwanted crosstalk. Further embodiments utilize combinations of added inductive coupling and multi-point compensative coupling using capacitive coupling. The use of both added inductive coupling and multi-point compensative coupling allows for more degrees of freedom than the sole use of conventional capacitive coupling in jack design when addressing crosstalk problems to allow for greater success in reducing and eliminating unwanted crosstalk. Use of inductive coupling and multi-point compensative coupling, in addition to conventional capacitive coupling, allows for minimization of both the crosstalk originating at the near-end of a communication connector as well as crosstalk originating at the far-end of the communication connector. It has been found that one purpose of inductive coupling and multi-point compensative coupling added to the compensating jack connector 100 is to reduce crosstalk that has a far-end origination with respect to the compensating jack connector. Both inductive coupling and multi-point compensative coupling can be used to compensate for near-end origination of crosstalk as well.

The amount of inductive coupling between two pairs of wires in a connector can be determined by treating each pair of wires as forming a wire loop having an associated magnetic flux. The amount of mutual inductance between two loops associated with two pairs of wires is dependent upon the amount of magnetic flux that is coupled between the loops. In turn, coupling of magnetic flux between two loops is dependent upon orientation and proximity of the loops with respect to each other. The closer the loops are in having a parallel orientation and the closer the loops are to one another, the higher the amount of inductive coupling that can occur between the loops. Also, reversing the current direction in one of the loops can change the coupling polarity.

As found in conventional connectors, pairs of "tip" and "ring" wires found in the conventional communication plug connector 40 are oriented to mutually couple magnetic flux to generate inductive coupling between the pairs. Typically, two pairs of wires, in particular, the center pair having the center "tip" wire 30a and the center "ring" wire 30b and the split pair having the split "tip" wire 34a and the split "ring" wire 34b are found to significantly contribute to crosstalk generated by mutual inductance. Both center and split pairs of wires found in the communication plug connector 40 have inductive coupling with a negative polarity and thus, to compensate, inductive coupling with a positive polarity is added to the compensating jack connector 100. In particular, inductive coupling is added in some embodiments of the present invention to the PC board 126. Since the PC board 126 electrically couples the contact members 114 with the wire connectors 116, the added inductive coupling can reduce crosstalk on signals entering the compensating jack connector 100 through the contact members 114 and the wire connectors 116.

Figure 4A:
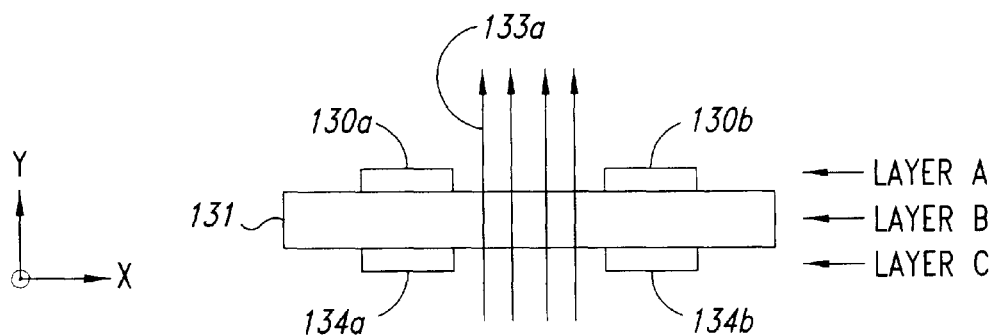
FIGS. 4A–4C are schematic diagrams showing various orientations of two pairs of "tip" and "ring" trace wires as laid out on a PC board associated with inductive coupling of the present invention.
Figure 7:
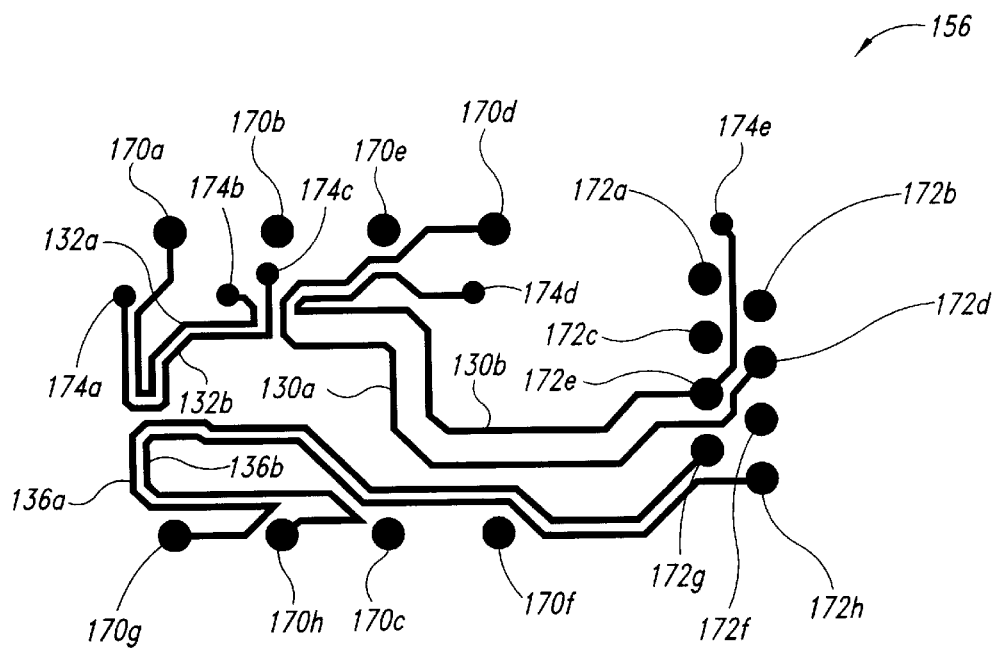
Figure 8:
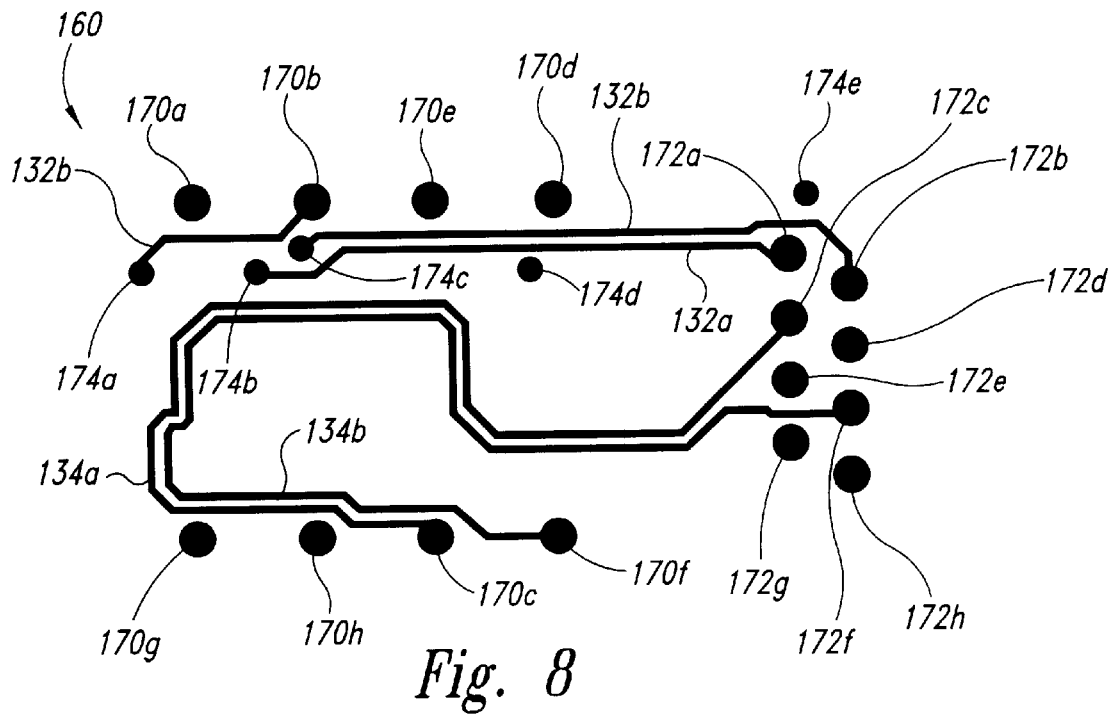
Figure 9:
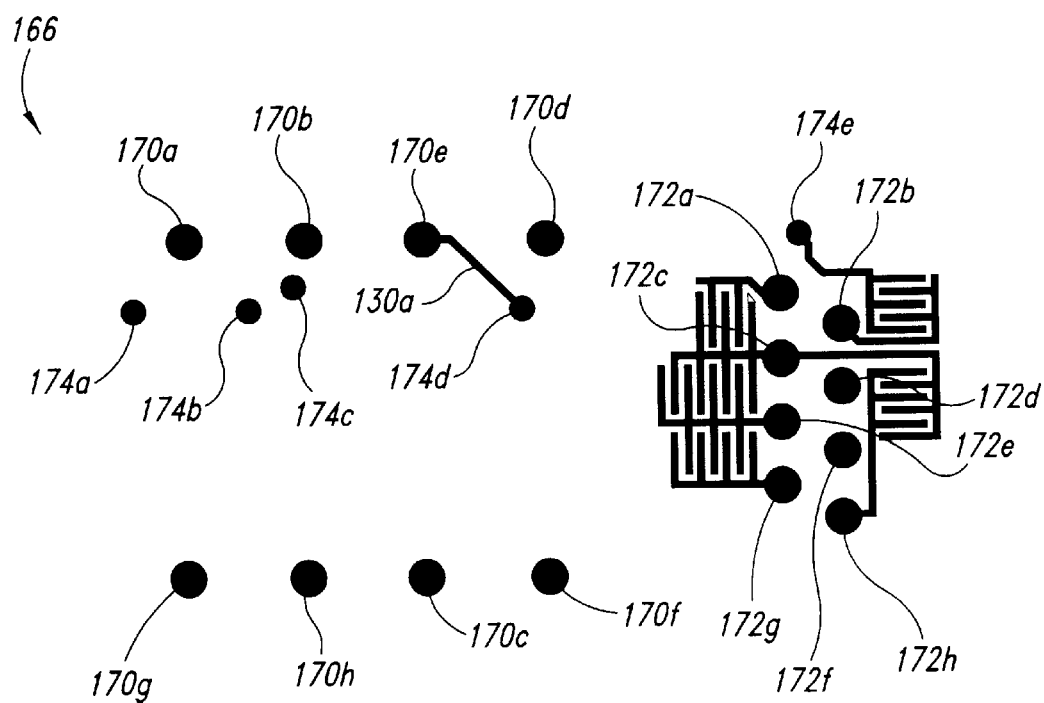

Inductive coupling and multi-point compensative coupling embodiments of the compensating jack connector 100 utilize a multi-layer structure of the PC board 126. In other embodiments single layer PC boards are used including having adjacent pairs of wire traces adjacent one another on a same surface. In a first embodiment of the PC board 126, a portion of which is shown in FIG. 4A, layers found on the PC board 126 have a first layer, Layer A, comprised of printed circuit board wire traces including center "tip" wire trace 130a and center "ring" wire trace 130b, shown in an end view in FIG. 4A, that are electrically coupled through the contact members 114 to the center "tip" wire 30a and the center "ring" wire 30b of the center pair in the communication plug connector 40 when the compensating jack connector 100 is engaged with the communication plug connector 40. The center "tip" wire trace 130a electrically couples a wire connector pad 170e (through an internal contact pad 174d) to a contact member pad 172e, both associated with "pin 5" as shown in FIGS. 7 and 9. The center "ring" wire trace 130b electrically couples a wire connector pad 170d to a contact member pad 172d, both associated with "pin 4" also as shown in FIG. 7. A second layer, Layer B, on the PC board 126 adjacent Layer A, comprises a dielectric material 131. A third layer, Layer C, comprises additional wire traces including spilt "tip" wire trace 134a and split "ring" wire trace 134b that are electrically coupled through the contact members 114 to the split "tip" wire 34a and the split "ring" wire 34b of the communication plug connector 40. The split "tip" wire trace 134a electrically couples a wire connector pad 170c to a contact member pad 172c, both associated with "pin 3" as shown in FIG. 8. The split "ring" wire trace 134b electrically couples a wire connector pad 170f to a contact member pad 172f, both associated with "pin 6" as shown in FIG. 8. As shown in FIGS. 7 and 8, wire connector pads 170a, 170b, 170g, and 170h are also electrically coupled with separate wire traces "tip" wire trace 132a, "ring" wire trace 132b, "tip" wire trace 136a, and "ring" wire trace 136b, respectively, to contact member pads 172a, 172b, 172g, and 172h associated with "pin 1," "pin 2," "pin 7," and "pin 8," respectively.

In the depicted inductive coupling embodiment, as shown in FIG. 4A, the center pair (pair 1) wire traces 130a and 130b are positioned so that their associated magnetic field shares much of the same space and is in the same direction as the associated magnetic field of the split pair (pair 3) wire traces 134a and 134b as shown by the arrows 133a. The magnetic fields of the center pair wire traces 130a and 130b and the split pair wire traces 134a and 134b are in the same direction in the area of the arrows 133a since both pairs have the same orientation of their "tip" and "ring" wires. That is, the center "tip" wire trace 130a shares substantially the same x-axis horizontal position as the split "tip" wire trace 134a, and the center "ring" wire trace 130b shares substantially the same x-axis horizontal position as the split "ring" wire trace 134b. Consequently, the magnetic fields of the center pair (pair 1) wire traces 130a and 130b and the split pair (pair 3) wire traces 134a and 134b are in the same direction and the resultant magnetic coupling between the center pair wire traces and the split pair wire traces is referred as being positive. In other words, magnetic flux acts to positively inductively couple the center pair and the split pair of wire traces along a "y-axis" vertical orientation, as shown in FIG. 4A. Resultant inductive coupling in the compensating jack connector 100 has a relative positive sign that is opposite in sign to the negative inductive coupling found between the center pair (pair 1) and the split pair (pair 3) of wires of the communication plug connector 40, as discussed above, whereby crosstalk originating in the communication plug connector 40 is substantially reduced or eliminated.

Figure 4B:
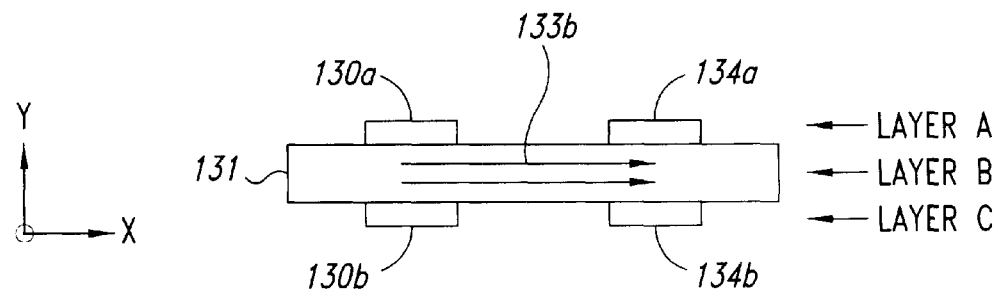

A second inductive coupling embodiment of the PC board 126, a portion of which is shown in FIG. 4B, has a different orientation of the wire traces for the center pair and the split pair in that Layer A has the center "tip" wire trace 130a and the split "tip" wire trace 134a while the Layer B has the center "ring" wire trace 130b and the split "ring" wire trace 134b. This configuration also results in a positive inductive coupling of sign opposite than the inductive coupling found between the center pair and the split pair of wires of the communication plug connector 40 with crosstalk originating in the communication plug connector 40 also substantially reduced or eliminated. In this second inductive coupling embodiment, magnetic flux acts to inductively couple the center pair and the split pair of wire traces along an "x-axis" horizontal orientation, as shown by the arrows 133b in FIG. 4B.

In both the first and second inductive coupling embodiments, the inductive coupling can be increased on the PC board 126 by moving the center pair and the split pair of "tip" and "ring" wire traces closer together or by increasing separation distance between "tip" and "ring" wire traces of one or more of the pairs. Moving the center and split pairs of wire traces closer together is a preferred method of increasing inductive coupling because increasing separation distance between the "tip" and "ring" wire traces of a pair detrimentally affects signal transmission quality associated with the pair.

Figure 4C:
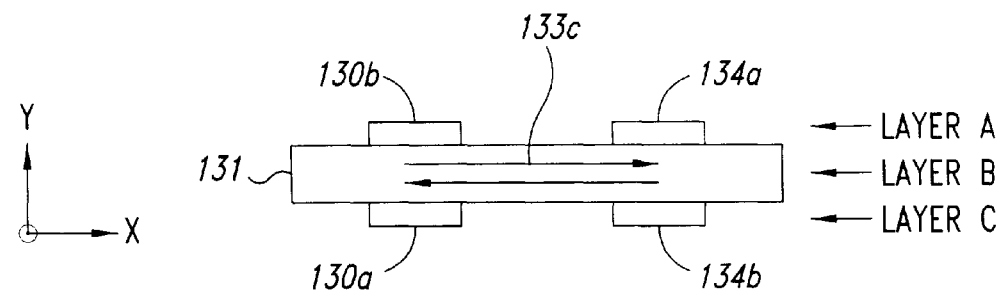

Positive inductive coupling added to the compensating jack connector 100 is typically required for cancellation of crosstalk resulting from inductive coupling between the combination of the center pair and the split pair of wires of the communication plug connector 40. On the other hand, inductive coupling between other combinations of "tip" and "ring" pairs of wires located in the communication plug connector 40 may require negative inductive coupling added to the compensating jack connector 100. Adding negative inductive coupling to the compensating jack connector 100 can be done by exchanging positions of "tip" and "ring" wire traces of one pair of inductively coupled pairs of wire traces. For instance, in a third inductive coupling embodiment shown in FIG. 4C, the positions of the center "tip" wire trace 130a and the center "ring" wire trace 130b are exchanged relative to their positions of the second inductive coupling embodiment, shown in FIG. 4B, while the positions of the split "tip" wire trace 134a and the split "ring" wire trace 134b remain the same relative to the second inductive coupling embodiment. Although, in the third inductive coupling embodiment, magnetic fields of the center pair wire traces 130a and 130b and the split pair wire traces 134a and 134b share space, the magnetic fields of the two pairs are in opposite directions as shown by the arrows 133c in FIG. 4C.

An alternative method to change the sign of inductive coupling in a given area is to change the direction of current flow in the given area. By having different direction of current flow in two cases, inductive coupling typically has opposite sign for the two cases whereas capacitive coupling has the same sign for the two cases. This method of reversing current flow can add extra flexibility in designing compensating circuits to substantially reduce or eliminate crosstalk.

In the depicted inductive coupling embodiment described below, inductive coupling and capacitive coupling are added to the PC board 126 using the principles described above. Refinements to achieve certain amounts of inductance and capacitance for designs of the PC board 126 were done through an iterative process utilizing both electromagnetic simulation modeling software with finite element analysis known in the art furnished by Ansoft Corporation, Pittsburgh, Pa. Runny on an HP J5000 Unix computer and with electronic test analyzer equipment furnished by Hewlett Packard Corporation including models HP 4380S96, HP 4396B, and HP 4380A. The test analyzer was connected to wire pairs 1–4 connected to the conventional communication plug connector 40 through the wire connectors 116. The conventional communication plug connector 40 was coupled to the compensating jack connector 100 through the physical engagement mechanism of standard RJ-45 connectors. The test analyzer was also connected to wire pairs 1–4 that were directly connected to the plug connector elements of the conventional communication plug connector 40.

The electromagnetic simulation modeling software was generally used to test ideas for particular layout designs for the PC board 126. The electronic test analyzer was used further to test design layouts and to further refine layout dimensions to achieve reductions in crosstalk. The test analyzer was used to send signals to the compensating jack connector 100 through the conventional communication plug connector 40 on a first pair of wires connected to the conventional communication plug connector and then was used to measure resultant amounts of crosstalk occurring on second, third, and fourth pairs of wires connected to the compensating jack connector. This depicted inductive coupling embodiment takes advantage of the inductive coupling methods of the present invention as well as capacitive coupling methods as found in conventional devices. Both near-end crosstalk and far-end crosstalk were measured and refinements to the PC board 126 were made until reductions in both near-end crosstalk and far-end crosstalk of approximately 40 dB were achieved with the compensating jack connector 100 coupled to the conventional plug connector

40 having measured capacitive coupling and inductive coupling as summarized in Table 1 above.

Figure 5:
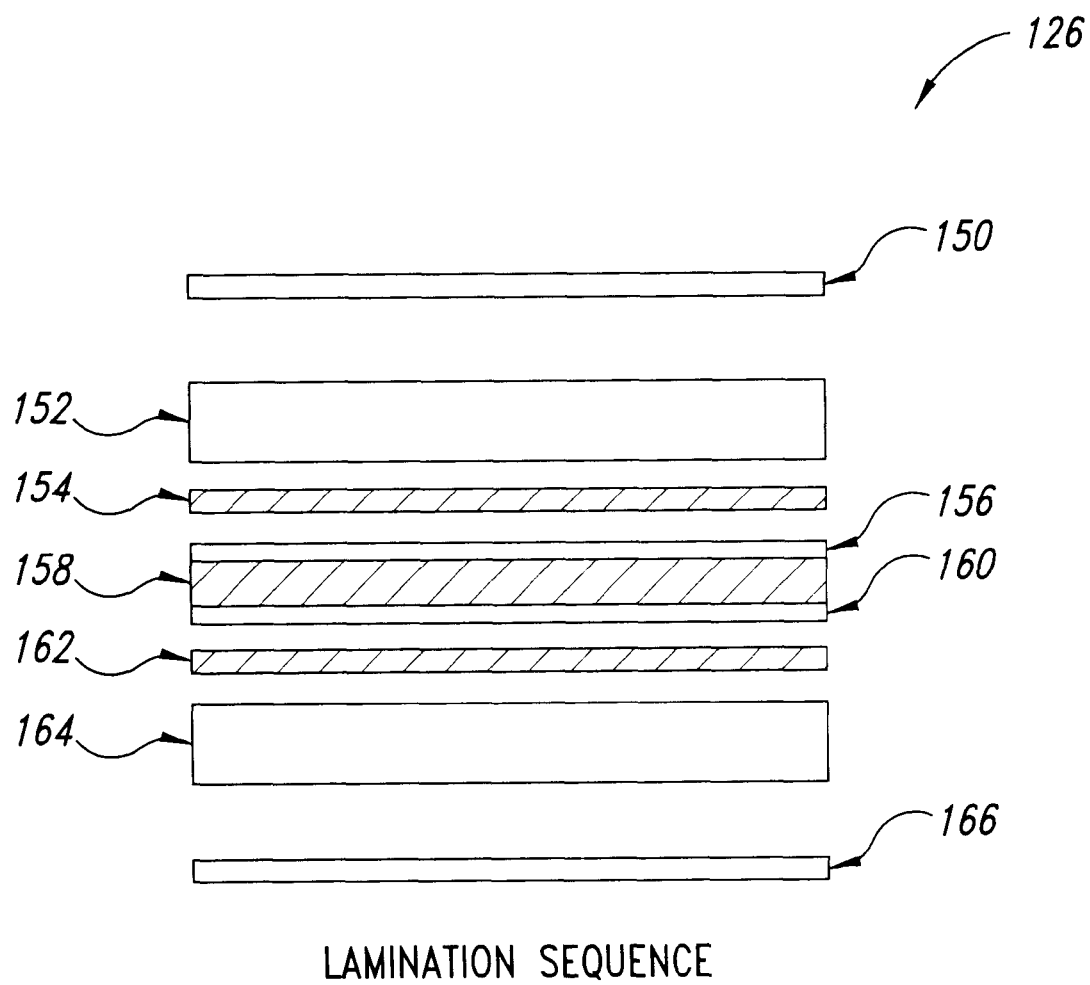
FIG. 5 is a schematic diagram showing a lamination sequence of the PC board of the compensating jack connector of FIG. 3.

To implement the PC board 126 for both the depicted inductive coupling and multi-point compensative coupling embodiments, the PC board shown in FIG. 5 comprises first and fourth wire trace layers 150 and 166 made from 1.5 oz finished copper, second and third wire trace layers 156 and 160 made from 2.0 oz finished copper, first and third dielectric layers 152 and 164 being 0.028 inches thick and having dielectric constants of 4.0, a second dielectric layer 158 being 0.008 inches thick and having a dielectric constant of 4.0, and first and second bonding material layers 154 and 162 being 0.009 inches thick. As shown in FIG. 5, an order of layering for the PC board 126 is as follows: the first wire trace layer 150, the first dielectric layer 152, the first bonding material layer 154, the second wire trace layer 156, the second dielectric layer 158, the third wire trace layer 160, the second bonding material layer 162, and the third dielectric layer 164.

Figure 6:
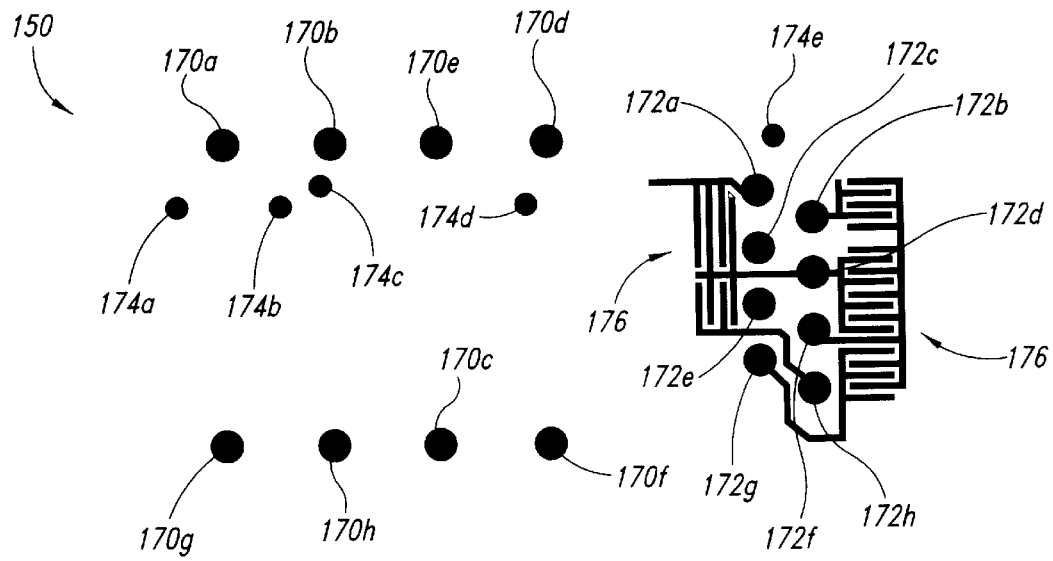
FIGS. 6–9 are schematic diagrams showing first through fourth wire trace layers, respectively, for an inductive compensative coupling embodiment of the lamination sequence of the PC board of FIG. 5.

The wire trace of the first wire trace layer 150 of the depicted inductive coupling embodiment is shown in FIG. 6. The first wire trace layer 150 includes wire connector pads 170*a*–170*h* that are electrically coupled to the wire connectors 116*a*–116*h*, respectively. The wire connector pads 170*a*–170*h* are similarly positioned on the second, third, and fourth wire trace layers 156, 160, and 166 as shown in FIGS. 7, 8, and 9, respectively, by extending through holes formed in the PC board 126. The first wire trace layer 150 also includes first contact member pads 172*a*–172*h* that are electrically coupled to the contact members 114*a*–114*h*, respectively. The first contact member pads 172*a*–172*h* are similarly positioned on the second, third, and fourth wire trace layers 156, 160, and 166 as shown in FIGS. 7, 8, and 9, respectively, by extending through holes formed in the PC board 126. The first wire trace layer 150 further includes internal contact pads 174*a*–174*e* that are similarly positioned on the second, third, and fourth wire trace layers 156, 160, and 166 as shown in FIGS. 7, 8, and 9, respectively, by extending through holes formed in the PC board 126.

One purpose for the first wire trace layer 150 is to add capacitive coupling using interdigitated wire traces in a manner known in the art as is done with capacitive wire trace portions 176 shown in FIG. 6. The fourth wire trace layer 166 adds capacitive coupling with capacitive wire trace portions 176 in a manner similarly used by the first wire trace layer 150. Further embodiments of the compensating jack connector 100 also use interdigitated wire traces to add capacitance whereas other embodiments use other ways of adding capacitance known in the art such as through discrete capacitive components. Table 2 below summarizes the capacitive coupling added by both the first wire trace layer 150 and the fourth wire trace layer 166 giving polarities of the capacitive coupling, the associated pin numbers of the contact member pads and the pair numbers of the wires electrically coupled to the contact member pads when the compensating jack connector 100 is physically engaged with the conventional communication plug connector 40. The contact member pads 172*a*–172*h* are associated with pin numbers 1–8, respectively. The pin numbers are associated with the pair numbers as shown in FIG. 2D and described above.

TABLE 2

| Pair Nos. | Pin Nos. Used 1st Layer/4th Layer | Capacitive Coupling for 1st/Layer/4th Layer (Polarity) picoFarads |
|---|---|---|
| 1, 2 | 1–4/2–5 | (Negative) 0.5/0.5 |
| 1, 3 | 4–6/3–5 | (Positive) 0.7/0.7 |
| 1, 4 | 4–8/5–7 | (Positive) 0.4/0.6 |
| 2, 3 | 2–6/1–3 | (Positive) 0.5/0.5 |
| 2, 4 | None | (None) |
| 3, 4 | 6–7/3–8 | (Negative) 0.6/0.5 |

Figure 10:
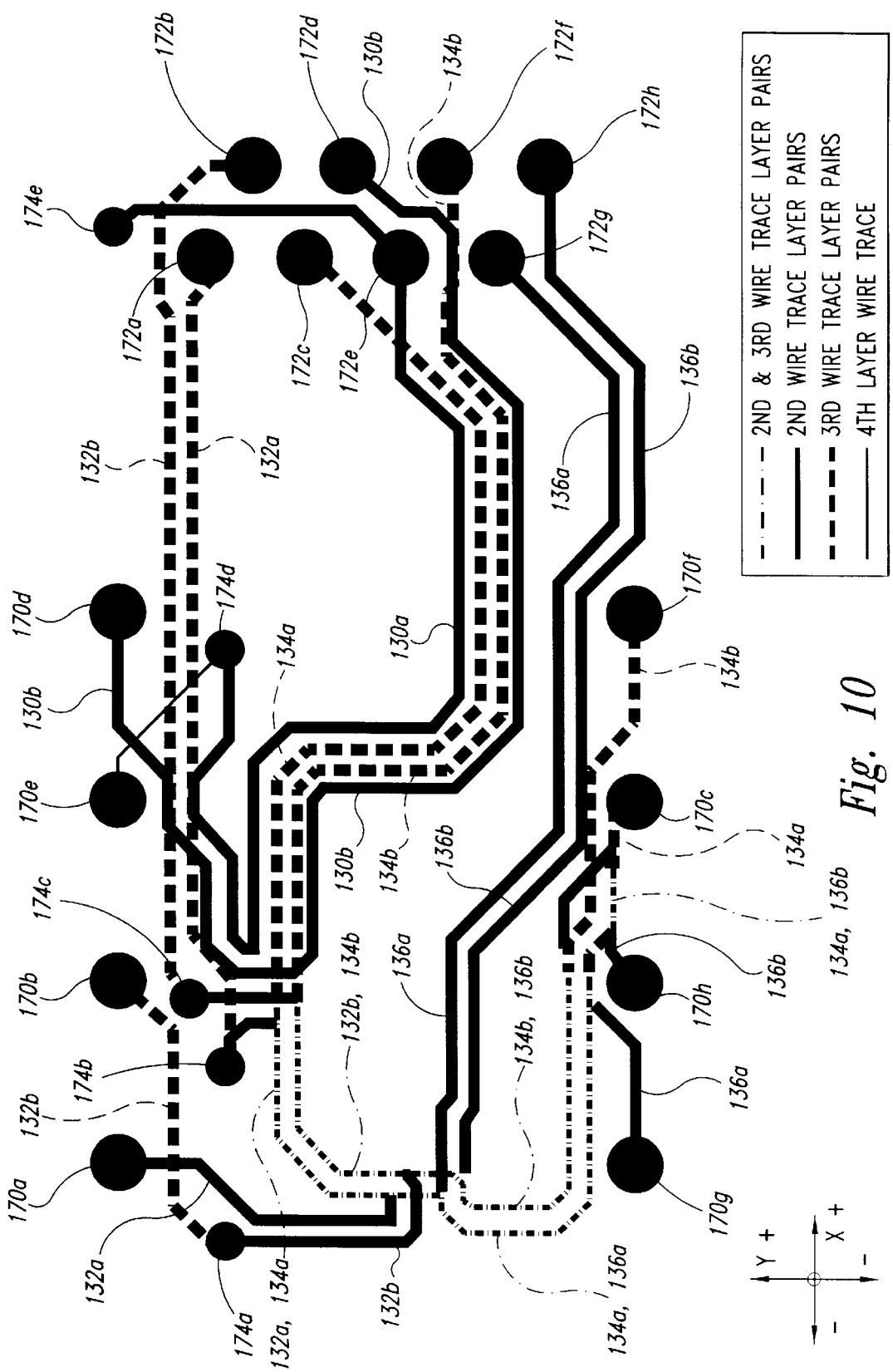
FIG. 10 is a schematic diagram of showing an overlay of the second wire trace layer of FIG. 7 and the third wire trace layer of FIG. 8.

The wire traces of the second wire trace layer 156 and the third wire trace layer 160 are shown for the depicted inductive coupling embodiment in FIGS. 7 and 8, respectively. The second and third wire trace layers 156 and 160 add inductive coupling through lengths of closely spaced pairs of wire traces positioned to be substantially overlaid relative to other closely spaced pairs of wire traces according to the principles described above regarding mutually coupled magnetic flux between associated pairs of wires. In FIG. 10, the wire traces of the second wire trace layer 156 (solid lines) and the third wire trace layer 160 (dashed lines) are shown overlaid on top of one another in a second-third layer overlay to illustrate where the closely spaced pairs of wire traces are overlaid relative to other closely spaced pairs of wire traces. Indication is made by dash—dot lines where the wire traces of the second wire trace layer 156 and the third wire trace layer 160 are in the same position.

The pair of "tip" and "ring" trace wires 130*a* and 130*b* (pair 1) are overlaid over the pair of "tip" and "ring" wire traces 132*a* and 132*b* (pair 2) for negative inductive coupling. For this pair 1–pair 2 overlay, the "tip" wire trace 130*a* is closer to the "tip" wire trace 132*a* than the "tip" wire trace 130*a* is to the "ring" wire trace 132*b*, and the "ring" wire trace 130*b* is closer to the "ring" wire trace 132*b* than the "ring" wire trace 130*b* is to the "tip" wire trace 130*a*. In some portions where the pair 1–pair 2 overlay occurs, the pair of "tip" and "ring" wire traces 130*a* and 130*b* having a separation distance between one another that significantly greater than the separation distance of the pair of "tip" and "ring" wire traces 132*a* and 132*b*, however, in this portion of the pair 1–pair 2 overlay relatively little inductive coupling occurs due to this significant difference between the separation distance of the "tip" and "ring" wire traces 130*a* and 130*b* and the separation distance of the "tip" and "ring" wire traces 132*a* and 132*b*. Most of the inductive coupling is occurring in the portion of the pair 1–pair 2 overlay where the pair of "tip" and "ring" wire traces 130*a* and 130*b* are spread substantially the same distance from one another as the pair of "tip" and "ring" wire traces 132*a* and 132*b*. As shown in FIG. 10, measurements of the PC board 126 indicate that polarity of inductive coupling for the pair 1–pair 2 overlay is negative, which is mostly likely because in the area of the pair 1–pair 2 overlay, electrical current for pair 1 is flowing oppositely than electrical current for pair 2. As shown in FIG. 10 in the area of the pair 1–pair 2 overlay, the pair 1 "tip" an "ring" wire traces 130*a* and 130*b* extend in a negative x-axis direction from the internal contact pad 174 (an extension of the wire connector pad 170*e*) and the wire connector pad 170*d* whereas in an opposite fashion the pair 2 "tip" and "ring" wire traces 132*a* and 132*b* extend in a negative x-axis direction from the contact member pads 172*a* and 172*b*, respectively.

For inductive coupling between the pairs 1 and 3 of the wire traces 130 and 134, the pair of "tip" and "ring" wire traces 130*a* and 130*b* (pair 1) are overlaid over the pair of "tip" and "ring" wire traces 134a and 134b (pair 3) for negative inductive coupling. For this pair 1–pair 3 overlay, the "tip" wire trace 130a is closer to the "tip" wire trace 134a than the "tip" wire trace 130a is to the "ring" wire trace 134b, and the "ring" wire trace 130b is closer to the "ring" wire trace 134b than the "ring" wire trace 130b is to the "tip" wire trace 134a. Where the pair 1–pair 3 overlay occurs, the pair 1 of "tip" and "ring" wire traces 130a and 130b are spread farther apart from each other than the pair 3 of "tip" and "ring" wire traces 134a and 134b.

Measurements of the PC board 126 indicate that polarity of inductive coupling for the pair 1–pair 3 overlay is negative, which is mostly likely because of the greater separation distance between the pair 1 of "tip" and "ring" wire traces 130a and 130b compared with the separation distance of the pair 3 "tip" and "ring" wire traces 134a and 134b. Using the basic principles discussed above, a first analysis would conclude that the polarity of the pair 1–pair 3 overlay would be positive since the "tip" and "ring" wire traces 130a and 134a and the "tip" and "ring" wire traces 134a and 134b are oriented similarly to the orientation shown in FIG. 4A with current flowing in the same direction for both pair 1 and pair 3. It is understood that the difference in spread distance between the pair 1 "tip" and "ring" wire traces 130a and 130b compared with the spread distance between the pair 3 "tip" and "ring" wire traces 134a and 134b as well as the parallel orientation of contact members 50 contribute to the measured negative inductive coupling for the pair 1–3 overlay. As a consequence, varying distance between the "tip" and "ring" wire traces of a first pair of wire traces compared with the distance between the "tip" and "ring" wire traces of a second pair of wire traces coupled to the first pair is another way of changing magnitude and coupling polarity in addition to orientation as described with FIGS. 4A–4C and direction of current relative to two inductively coupled pairs of wire traces.

The pair of "tip" and "ring" wire traces 132a and 132b (pair 2) are overlaid over the pair of "tip" and "ring" wire traces 134a and 134b (pair 3) for positive inductive coupling. For this pair 2–pair 3 overlay, the "tip" wire trace 132a is closer to the "tip" wire trace 134a than the "tip" wire trace 132a is to the "ring" wire trace 134b, and the "ring" wire trace 132b is closer to the "ring" wire trace 134b than the "ring" wire trace 132b is to the "tip" wire trace 134a. Where the pair 2–pair 3 overlay occurs, the pair 2 of the "tip" and "ring" wire traces 132a and 132b are spread the same distance from each other as the pair 3 of the "tip" and "ring" wire traces 134a and 134b. Measurements of the PC board 126 indicate that polarity of inductive coupling for the pair 2–pair 3 overlay is positive, which is expected given the discussion above regarding FIG. 4A with current in the pair 2 of the "tip" and "ring" wire traces 132a and 132b and the pair 3 of the "tip" and "ring" wire traces 134a and 134b flowing in the same direction.

The pair of "tip" and "ring" wire traces 134a and 134b (pair 3) are overlaid over the pair of "tip" and "ring" wire traces 136a and 136b (pair 4) for positive inductive coupling. For this pair 3–pair 3 overlay, the "tip" wire trace 134a is closer to the "tip" wire trace 136a than the "tip" wire trace 134a is to the "ring" wire trace 136b and the "ring" wire trace 134b is closer to the "ring" wire trace 136b than the "ring" wire trace 134b is to the "tip" wire trace 136a. Where the pair 3–pair 4 overlay occurs, the pair 3 of "tip" and "ring" wire traces 134a and 134b are spread the same distance as the pair 4 of "tip" and "ring" wire traces 136a and 136b. Measurements of the PC board 126 indicate that polarity of inductive coupling for the pair 3–pair 4 overlay is positive, which is mostly likely because of the larger spread distance between the pair 1 of "tip" and "ring" wire traces 130a and 130b compared with the spread distance of the pair 3 "tip" and "ring" wire traces 134a and 134b. Using the basic principles discussed above, a first analysis would conclude that the polarity of the pair 1–pair 3 overlay would be positive, which is expected given the discussion above regarding FIG. 4A with current in the pair 3 of the "tip" and "ring" wire traces 134a and 134b and the pair 4 of the "tip" and "ring" wire traces 136a and 136b flowing in the same direction. Thus, other factors, such as differences between distances between wire trace pairs can influence magnitude and polarity of inductive compensative coupling.

The inductive coupling of the second wire trace layer 156, third wire trace layer 160 and associated pair numbers are summarized in Table 3 below. Also indicated is the layer number used for each pair of the two pair overlays.

TABLE 3

| Pairs Nos. | 2nd Layer Pair | 3rd Layer Pair | Inductive Coupling Polarity/NanoHenries |
|---|---|---|---|
| 1, 2 | 1 | 2 | Negative/1.3 |
| 1, 3 | 1 | 3 | Negative/1.5 |
| 1, 4 | None | None | None |
| 2, 3 | 2 | 3 | Positive/1.1 |
| 2, 4 | None | None | None |
| 3, 4 | 4 | 3 | Positive/2.1 |

Figure 11:
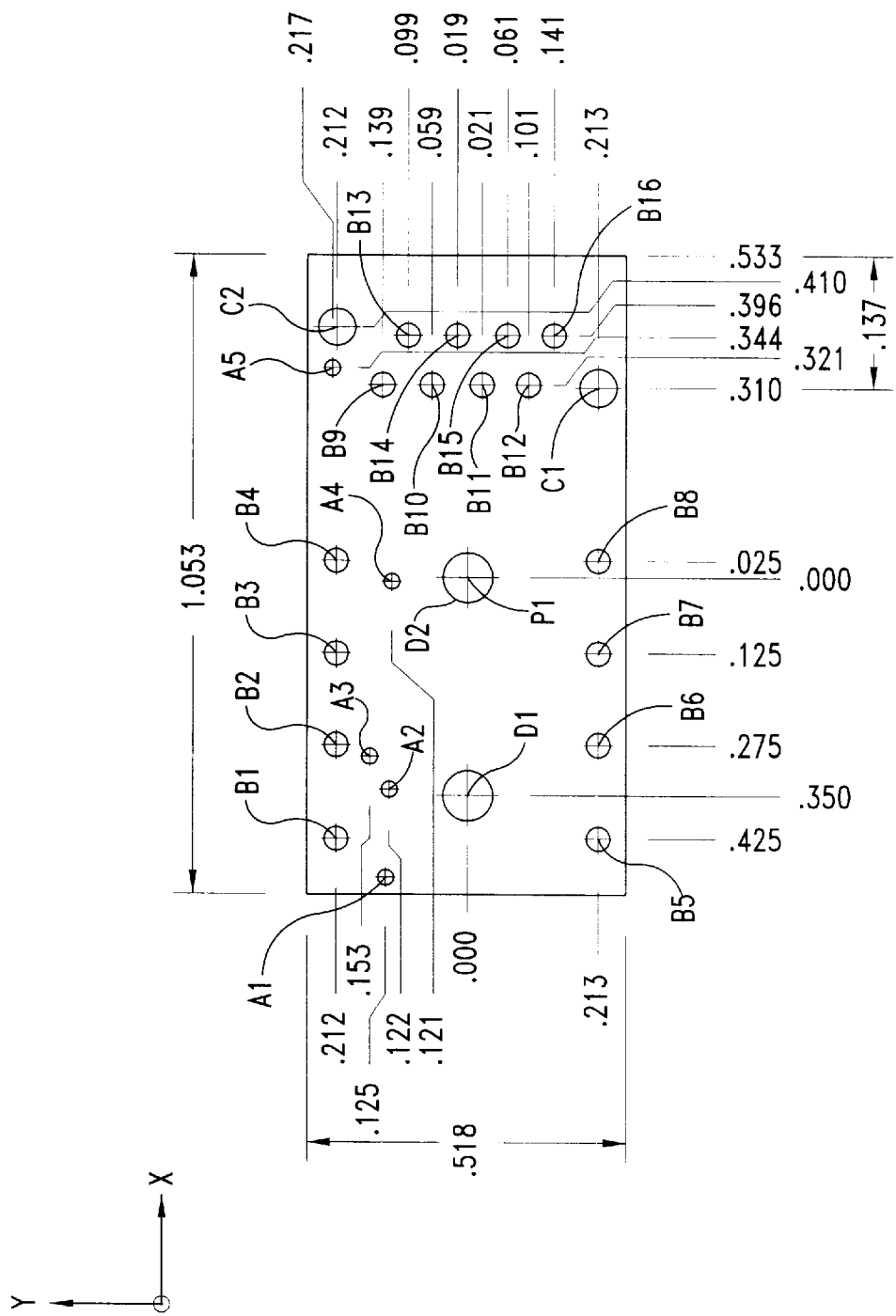
FIG. 11 is schematic diagram showing dimensions of hole placement corresponding to the pad layout corresponding to the first through fourth wire trace layers of FIGS. 6–9.

As mentioned above, the wire connector pads 170, the contact member pads 172, and the internal contact pads 174, all shown in FIGS. 6–10, extend through holes drilled in the PC board 126. Hole placement in the PC board 126 is illustrated in FIG. 11. Five holes, A1–A5, have diameters of 0.020 inches; sixteen holes, B1–B16 have diameters of 0.035 inches; two holes, C1–C2, have diameters of 0.065 inches; and two holes, D1–D2 have diameters of 0.085 inches. Dimensions for hole placement are given in FIG. 11 with respect to a central point P1. In FIG. 11, numbers adjacent vertical lines indicate distance in inches along the x-axis from the center point and numbers adjacent horizontal lines indicate distance in inches along the y-axis from the center point. For instance, hole B5 is 0.425 inches along the x-axis and 0.213 inches along the y-axis from the center point P1. As another example, hole C2 is 0.410 inches along the x-axis and 0.212 inches along the y-axis from the center point P1.

It should also be noted that the compensating jack connector 100 can be made in a wall mount version and other versions including those that are free-standing. The principles of the present invention are intended to encompass all such variations of communication connectors. In addition, the present invention is intended to encompass communication connectors other than the RJ45 style, and may include a greater or lesser number of twisted pair cables. Thus, the present invention set forth in the accompanying exemplary embodiments above reduces crosstalk by adding inductive coupling to compensate for crosstalk originating by at least one of capacitive and inductive coupling.

MULTI-POINT COMPENSATIVE COUPLING

Other embodiments of the compensating jack connector 100 use multi-point compensative coupling to reduce and eliminate unwanted crosstalk of near-end and far-end origination. In general, unwanted crosstalk occurring at a first location of a communication system can be canceled by opposite polarity crosstalk in a second location of the communication system, however, as frequencies of the signals involve increase, distance between the first and second locations begin to hinder efforts to cancel the unwanted crosstalk.

When frequencies of signals are high, the speed of propagation of the associated electrical waves between the first and second locations becomes more of a factor in determining efficacy of crosstalk cancellation. As frequency of the signals involved increases, the difference in phase of the wave fronts of the signals at the first and second locations also increases. The reduction that is theoretically possible in crosstalk originating at a first location on a pair of wires in a communication system using compensating crosstalk of opposite magnitude introduced at a second location of the pair wires in the communication system is $20*\log_{10}(\tan(d*f/v))$ where v is the velocity of electrical waves within the communication system, d is the distance between the first and second locations, and f is the frequency of the electrical signals involved. As an example, with a separation distance of 1 inch, a velocity of propagation of $2/3$ the speed of light, the theoretically possible reduction in crosstalk for a signal frequency of 100 MHz is −17 dB. This amount of reduction may not be acceptable for certain circumstances pertaining to current data communication standards such as Category 5 cabling for high frequency data traffic.

In addition to the inductive coupling described above, multi-point compensative coupling is another new approach for tailored solutions to crosstalk reduction. With multi-point compensative coupling, unwanted and compensating crosstalk signals associated with a pair of wires are treated as discrete signals with the differing points of originations on the wire pair being described in terms of delay time for propagation of crosstalk signals between the points of origination on the wire pair of the unwanted and compensating crosstalk signals. Based on this treatment, transfer functions associated with delay line filters can be used to describe the related physics.

The origination point of unwanted crosstalk to be compensated for is described as being located at a zero time delay on the wire pair. An assumption is made that the crosstalk signals involved are arising either from capacitive or inductive coupling, so that these crosstalk signals are described in terms of imaginary numbers with magnitudes that increase directly with an increase in the associated frequencies of the crosstalk signals involved. The multi-point compensative coupling approach describes the origination points of compensating crosstalk signals as being located on the wire pair at time delays greater than zero. The compensating crosstalk signals can have either the same or opposite polarity as the unwanted crosstalk signals, so that if an unwanted crosstalk signal had a positive polarity, then a compensating crosstalk signal of the same polarity as the unwanted crosstalk signal would have a positive polarity and a compensating crosstalk signal having an opposite polarity would have a negative polarity.

This approach of associating unwanted and compensating crosstalk signals allows for a response function to describe the combination of unwanted and compensating crosstalk signals on the wire pair as follows in Equation 1.

$$H(jw) = K\left(C_0 + \sum_{i=1}^{n} C_i \varepsilon^{jwT_i}\right) \quad (1)$$

Here, n represents the number of origination points for compensating crosstalk signals and w represents the frequency of the signals. The origination point for each compensating crosstalk signal is described as having an origination point with a time delay $T_i$. $C_i$ represents magnitudes of the compensating crosstalk signals if only one point of origination exits on the wire pair for the unwanted crosstalk and $C_0$ represents the magnitude of the unwanted crosstalk signal at its point origination on the wire pair. More than one unwanted crosstalk signal originating on the wire pair can also be treated by assigning $C_0$ to the unwanted crosstalk signal with a point of origination on the wire pair located farthest from the points of origination on the wire pair of the compensating crosstalk signals and by assigning $C_1$ to the unwanted crosstalk signal having a point of origination on the wire pair that is next farthest from the points of origination of the compensating crosstalk signals, and so on for the number of unwanted crosstalk signals. As an example, the response for the wire pair having one unwanted crosstalk signal and no compensating crosstalk signals would be $H(jw)=C_0$.

If the sole point of origination on the wire pair for unwanted crosstalk is modeled as a capacitor having a value of C, with the wire pair being represented by an R ohm transmission line, then $KC_0=jwRC$. The coefficients $C_i$ can be described relative to the unwanted crosstalk signal by setting $C_0=1$ resulting in an expression for the response of the commnunication system as found in Equation 2.

$$H(jw) = jwR\frac{C}{2}\left(1 + \sum_{i=1}^{n} C_i \varepsilon^{jwT_i}\right) \quad (2)$$

A simple single point compensative coupling approach using capacitive coupling would seek a solution to Equation 2 for frequency, w, equal to zero resulting in Equation 3.

$$C_0 = \sum_{i=1}^{n} C_i \varepsilon^{jwT_i}\bigg|_{w=0} = \sum_{i=1}^{n} C_i \quad (3)$$

This is the design criteria for conventional simple capacitive compensation known in the art with respect to capacitive coupling and implemented by adding capacitors having the same time delay distance relative to the one or more points of unwanted crosstalk for a particular wire pair.

Multi-point compensative coupling goes beyond this simple capacitive compensation of the prior art by using compensative coupling (either capacitive, inductive, or both) at points of origination having different time delay distances relative to the one or more points of origination of unwanted crosstalk. To solve for the amount of compensative coupling to be used at the more than one points of origination of the multi-point compensative coupling, successive derivatives are taken of the response function of the particular communication system, generally described in Equation 1 and set to zero at w=0, resulting in the first three successive derivative equations as follows: the first order derivative Equation 4, the second order derivative Equation 5, and the third order derivative Equation 6, respectively.

$$C_0 = \sum_{i=1}^{n} T_i C_i \varepsilon^{jwT_i}\bigg|_{w=0} = 0 \text{ or,} \quad (4)$$

$$\sum_{i=1}^{n} T_i C_i = 0$$

$$\sum_{i=1}^{n} T_i^2 C_i = 0 \quad (5)$$

$$\sum_{i=1}^{n} T_i^3 C_i = 0 \quad (6)$$

Higher order derivative equations are used if more points of origination for multi-point compensative coupling are available or if more points of origination for unwanted crosstalk are involved. In general, the number of the highest order derivative equation necessary for a unique solution to the multi-point compensative coupling on the wire pair is equal to the number of points of origination on the wire pair for compensative coupling having different time delay distances with respect to the points of origination of unwanted crosstalk plus the number of points of origination on the wire pair for unwanted crosstalk minus two. As the number of origination points available for compensating coupling having different time delay distances with respect to the one or more origination points of unwanted crosstalk increases, the greater potential for a more complete reduction of the unwanted crosstalk, especially at the high signal frequencies required for data transmission.

For instance, if there are three locations $P_1$, $P_2$, and $P_3$ at different time delay distances with respect to the points of origination of unwanted crosstalk available on the compensating jack connector 100 for multi-point compensative coupling having time delay distances of $T_1$, $T_2$, and $T_3$, respectively, from the a point of origination of unwanted crosstalk, and if there is only one point of origination for unwanted crosstalk based on an unwanted coupling, then the second order derivative Equation 5 will be the highest order equation needed for a solution multi-point compensative coupling. In this case, $C_0$ will be equal to the amount of unwanted coupling at the point of origination of the unwanted crosstalk. Equations 3 through 5 will be used to arrive at solutions for the multi-point compensative coupling $C_1$, $C_2$, and $C_3$ for the locations $P_1$, $P_2$, and $P_3$, respectively. As an example, the unwanted crosstalk could originate from unwanted capacitive coupling, $C_0$ and the multi-point compensative coupling, $C_1$, $C_2$, and $C_3$ could be capacitive as well.

If there are first and second points, $O_1$ and $O_2$, of origination inside the conventional communication plug connector 40 of unwanted crosstalk, where the first point $O_1$ is farther from the front face 40$a$ of the conventional communication plug connector than the second point $O_2$, then $T_1$, will be equated to the time delay distance between the points $O_1$ and $O_2$. $C_0$ and $C_1$ will be equated to the amount of unwanted coupling associated with points $O_1$ and $O_2$, respectively. Then if there are three locations $P_2$, $P_3$, and $P_4$ available on the compensating jack connector 100 for multi-point compensative coupling, $T_2$, $T_3$, and $T_4$ will be equated to the time delay distances between the three locations, $P_2$, $P_3$, and $P_4$, and the first point, $O_1$ respectively. The third order Equation 6 will be the highest order equation used in this case so that Equations 3 through 6 will then be used to arrive at solutions for the multi-point compensative coupling $C_2$, $C_3$, and $C_4$ for the locations $P_2$, $P_3$, and $P_4$, respectively. As an example, the unwanted crosstalk could originate from unwanted capacitive coupling, $C_0$ and $C_1$, and the multi-point compensative coupling, $C_2$, $C_3$, and $C_4$ could be capacitive as well.

To facilitate solution, the Equations 3 through 5 and extending to a generalized higher order n can be put in matrix form as Equation 7. Once the number an positions of the compensations are decided on, the coefficients that result from the solution of Equation 7 yield the optimum individual compensation values for multi-point compensative coupling.

$$\begin{bmatrix} 1 & 1 & 1 & \cdots & 1 \\ T_1 & T_2 & T_3 & \cdots & T_n \\ T_1^2 & T_2^2 & T_3^2 & \cdots & T_n^2 \\ \cdots & \cdots & \cdots & \cdots & \cdots \\ T_1^n & T_2^n & T_3^n & \cdots & T_n^n \end{bmatrix} \begin{bmatrix} C_1 \\ C_2 \\ C_3 \\ \cdots \\ C_n \end{bmatrix} = \begin{bmatrix} -C_0 \\ 0 \\ 0 \\ \cdots \\ 0 \end{bmatrix} \quad (7)$$

If both $C_0$ and $C_1$ are both known, the set of equations to be solved is reduced to Equation 8. When more coefficients are known, the left most matrix is reduced in size and the known TC moment values are subtracted from the right hand side.

$$\begin{bmatrix} 1 & 1 & \cdots & 1 \\ T_2 & T_3 & \cdots & T_n \\ \cdots & \cdots & \cdots & \cdots \\ T_2^n & T_3^n & \cdots & T_n^n \end{bmatrix} \begin{bmatrix} C_2 \\ C_3 \\ \cdots \\ C_n \end{bmatrix} = \begin{bmatrix} -C_0 \\ 0 \\ \cdots \\ 0 \end{bmatrix} + \begin{bmatrix} -C_1 \\ -T_1 C_1 \\ \cdots \\ -T_n C_n \end{bmatrix} \quad (8)$$

As another example, it is given that for a given wire pair the points of origination $P_1$, $P_2$, and $P_3$ were available in the compensating jack connector 100 having time delay distances of 1, 1.5, and 3.0 away from a single point of origination of unwanted crosstalk found in the conventional communication plug connector 40 with an unwanted capacitive coupling of 1. The time delay distances could be expressed in terms of time required for signal travel (such as picoseconds) or distance (such as fractions of an inch). From Equation 3, $C_1+C_2+C_3=C_0=-1$, which has many possible solutions, however, Equation 7 provides the matrix shown in Equation 9.

$$\begin{bmatrix} 1 & 1 & 1 \\ 1 & 1.5 & 3 \\ 1 & 2.25 & 9 \end{bmatrix} \begin{bmatrix} C_1 \\ C_2 \\ C_3 \end{bmatrix} = \begin{bmatrix} -1 \\ 0 \\ 0 \end{bmatrix} \quad (9)$$

Solving for Equation 9 yields $C_1=-4.5$, $C_2=4$, and $C_3=-0.5$. In some embodiments the compensative coupling is in the form of capacitance and the units involved would be typically expressed in picoFarads.

Another example has a first origination point, $O_1$, of unwanted coupling in the convention communication plug connector 40 having an associated $C_0$ of 10 and a second origination point of unwanted coupling having an associated $C_1$ of −9 and being closer to the front face 40$a$ of the conventional plug connector than the first point and being a time delay distance of 0.1 from the first point. If there are two points of origination, $P_1$ and $P_2$, for multi-point compensative coupling on the compensating jack connector 100 having time delay distances of 1 and 2.25, respectively, from the first origination point, $O_1$, then Equation 8 yields $C_2+C_3=-C_0-C_1=-10+9=-1$ and $T_2C_2+T_3C_3=C_2+2.25C_3=0-T_1C_132$ 0.9. The solution to these two equations for $C_2$ and $C_3$ is $C_2=-2.52$ and $C_3=1.52$.

Two embodiments described herein use both inductive compensative coupling and multi-point compensative coupling. The first of these two inductive/multi-point compensative coupling embodiments is incorporated into the compensating jack connector 100 with layout designs for the wire traces of the wire trace layers 150, 156, 160, and 166 of the PC board 126 as illustrated in FIGS. 12–17. The second of these two inductive/multi-point compensative coupling embodiments involves a multiple compensating jack connector 200 having a multiple jack PC board 226, shown in FIGS. 18–23 and further described below.

For the depicted inductive/multi-point compensating jack connector 100, the first wire trace layer 150 contributes capacitance for multi-point capacitive coupling and other capacitive coupling, the second and third wire trace layers 156 and 160 provide inductive coupling and the fourth wire trace layer 166 contributes capacitance for multi-point capacitive coupling and other capacitive coupling.

Figure 12:
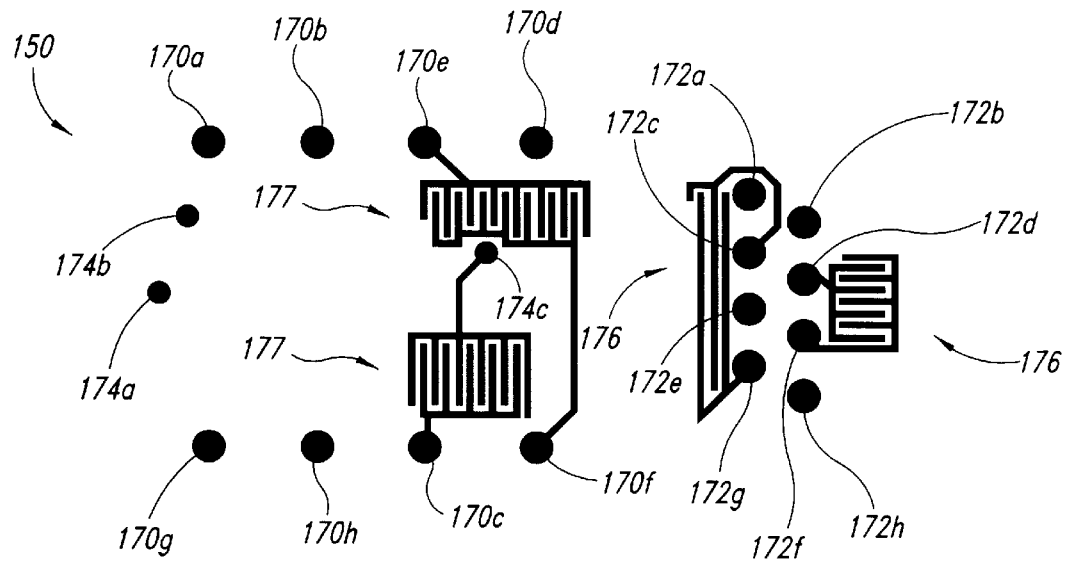
FIGS. 12–15 are schematic diagrams showing first through fourth wire trace layers, respectively, for a multipoint compensative coupling embodiment of the lamination sequence of the PC board of FIG. 5.
Figure 13:
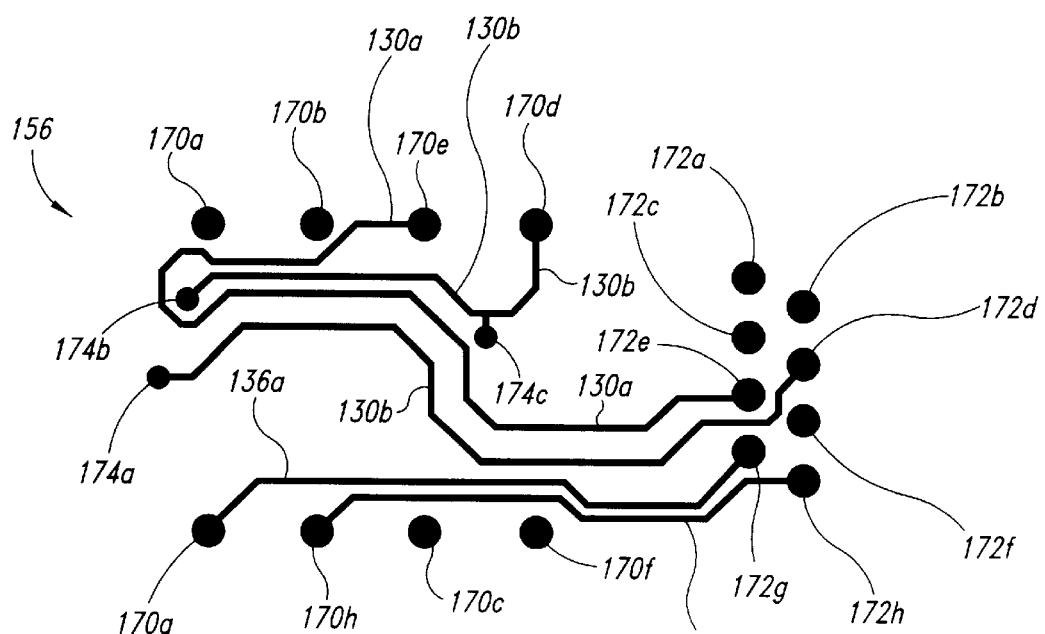
Figure 14:
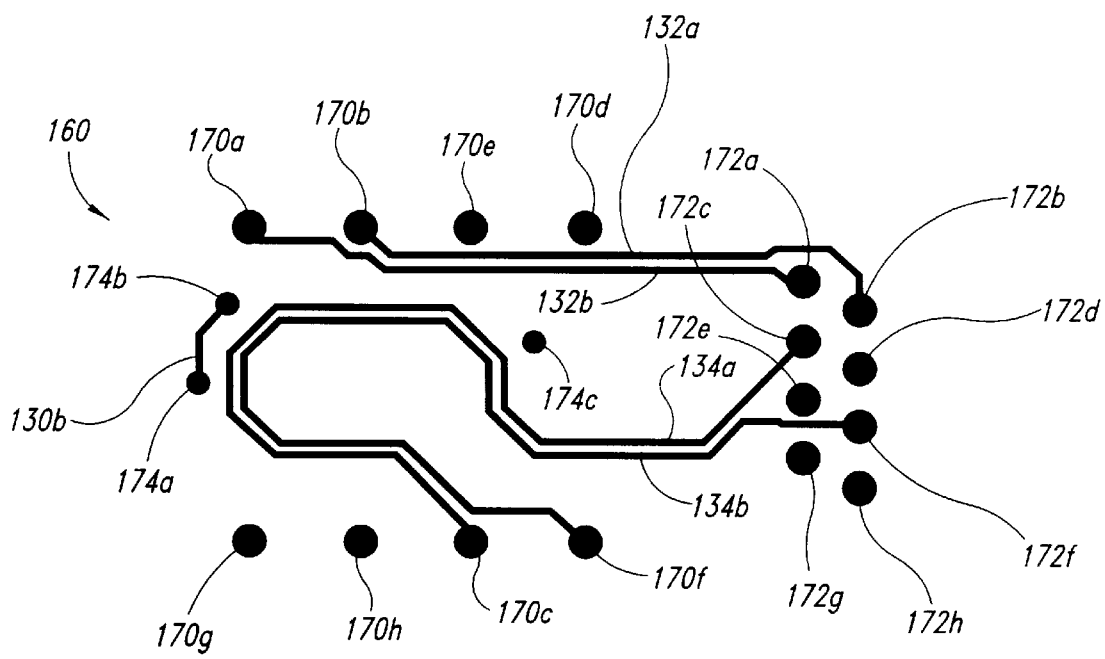
Figure 15:
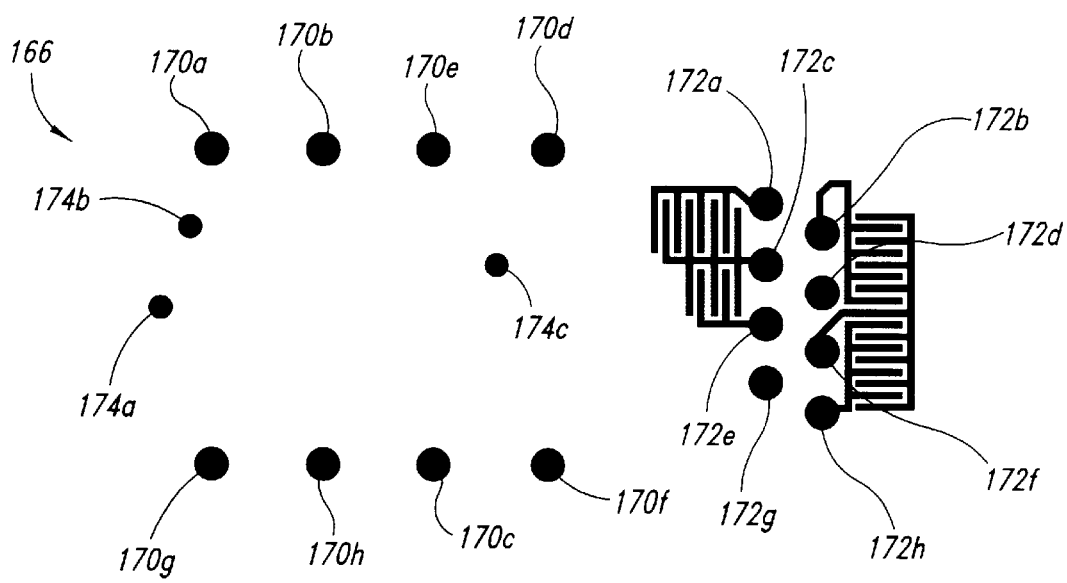

Both the first and fourth wire trace layers 150 and 166 contribute capacitance for a multi-point capacitive coupling having two origination points of compensating capacitive coupling in the compensating jack connector 100 to reduce unwanted crosstalk originating on and between pair 1 of the center "tip" wire 30a and the center "ring" wire 30b and pair 3 of the split "tip" wire 34a and the center "ring" wire 34b. As shown in FIG. 12, inter-digitated capacitance 177 is used between wire connector pads 170c and 170d and between wire connector pads 170e and 170f to introduce the first of the two points of multi-point capacitive coupling for the combinations of pairs 1 and 3 having a negative polarity that is the same polarity as that of the unwanted capacitive, and inductive coupling for the combination of pairs 1 and 3 for the conventional communication plug connector 40 as shown above in Table 1.

The first wire trace layer 150 includes inter-digitated capacitance between the contact member pads 172d and 172f and the fourth wire trace layer 166 includes inter-digitated capacitance between contact member pads 172c and 172e to add the second of the two points of multi-point capacitive coupling for the combinations of pairs 1 and 3 having a positive polarity opposite to the polarity of the first point of multi-point capacitive coupling in the compensating jack connector 100 and the unwanted capacitive coupling originating in the conventional communication plug connector 40 for pairs 1 and 3.

The first wire trace layer 150 includes inter-digitated capacitance between the contact member pads 172c and 172g for other compensating capacitive coupling. The fourth wire trace layer 166 also includes inter-digitated capacitance between contact member pads 172a and 172c, between 172c and 172e, between 172b and 172f, and between 172f and 172h. Measured capacitances of this depicted inductive/multi-point compensating jack connector 100 are shown in Table 4 below.

TABLE 4

| Pair Nos. | Pin Nos. Used 1st Layer/4th Layer | Capacitive Coupling for 1st/Layer/4th Layer picoFarads |
|---|---|---|
| 1, 2 | | |
| 1, 3 | 4–6, 3–4, 5–6/3–5 | +0.6, –1.2, –1.0/+0.6 |
| 1, 4 | | |
| 2, 3 | /1–3, 2–6 | /+1.0, +1.1 |
| 2, 4 | | |
| 3, 4 | 3–7/6–8 | +1.0/+1.1 |

Figure 16:
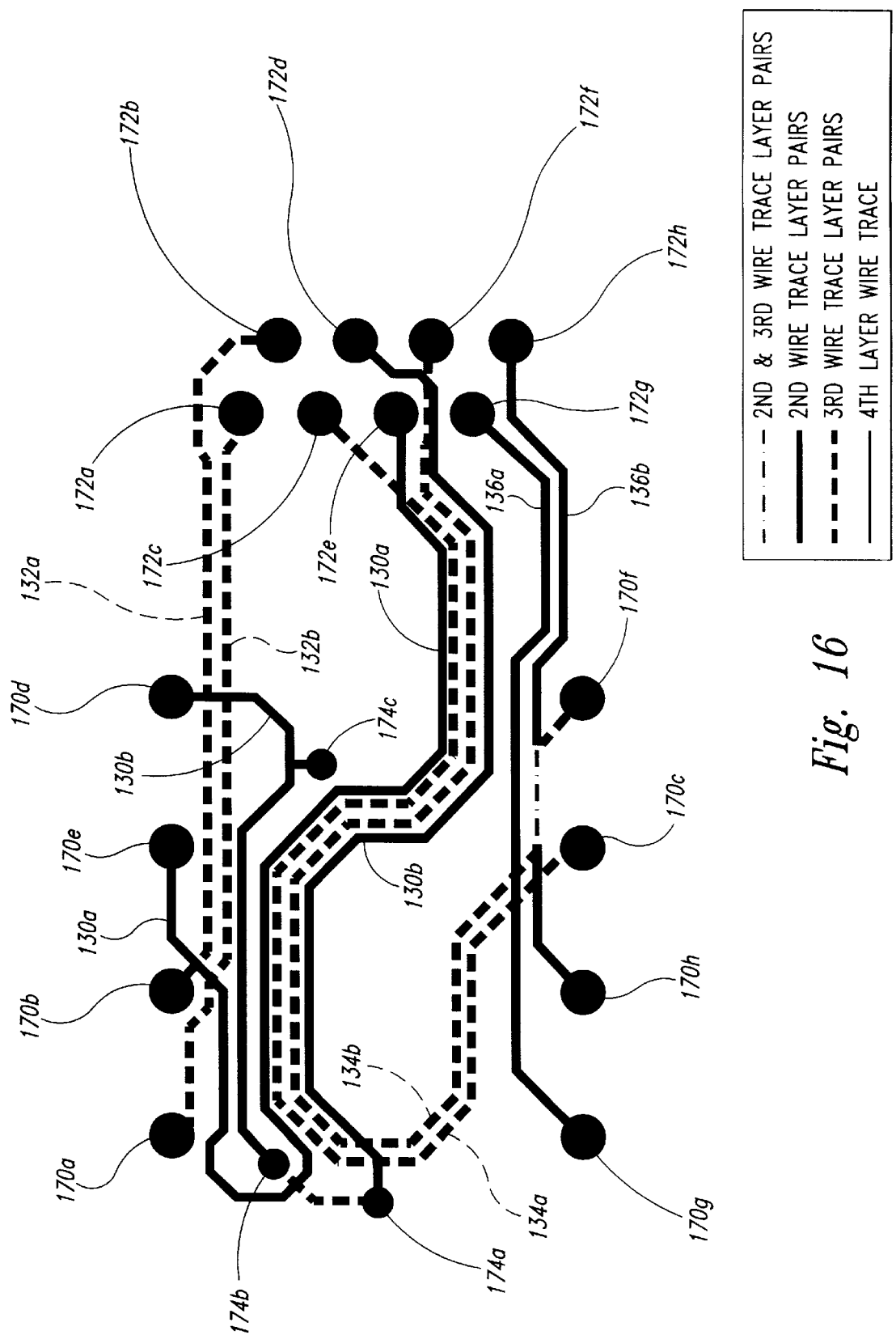
FIG. 16 is a schematic diagram of showing an overlay of the second wire trace layer of FIG. 13 and the third wire trace layer of FIG. 14.
Figure 17:
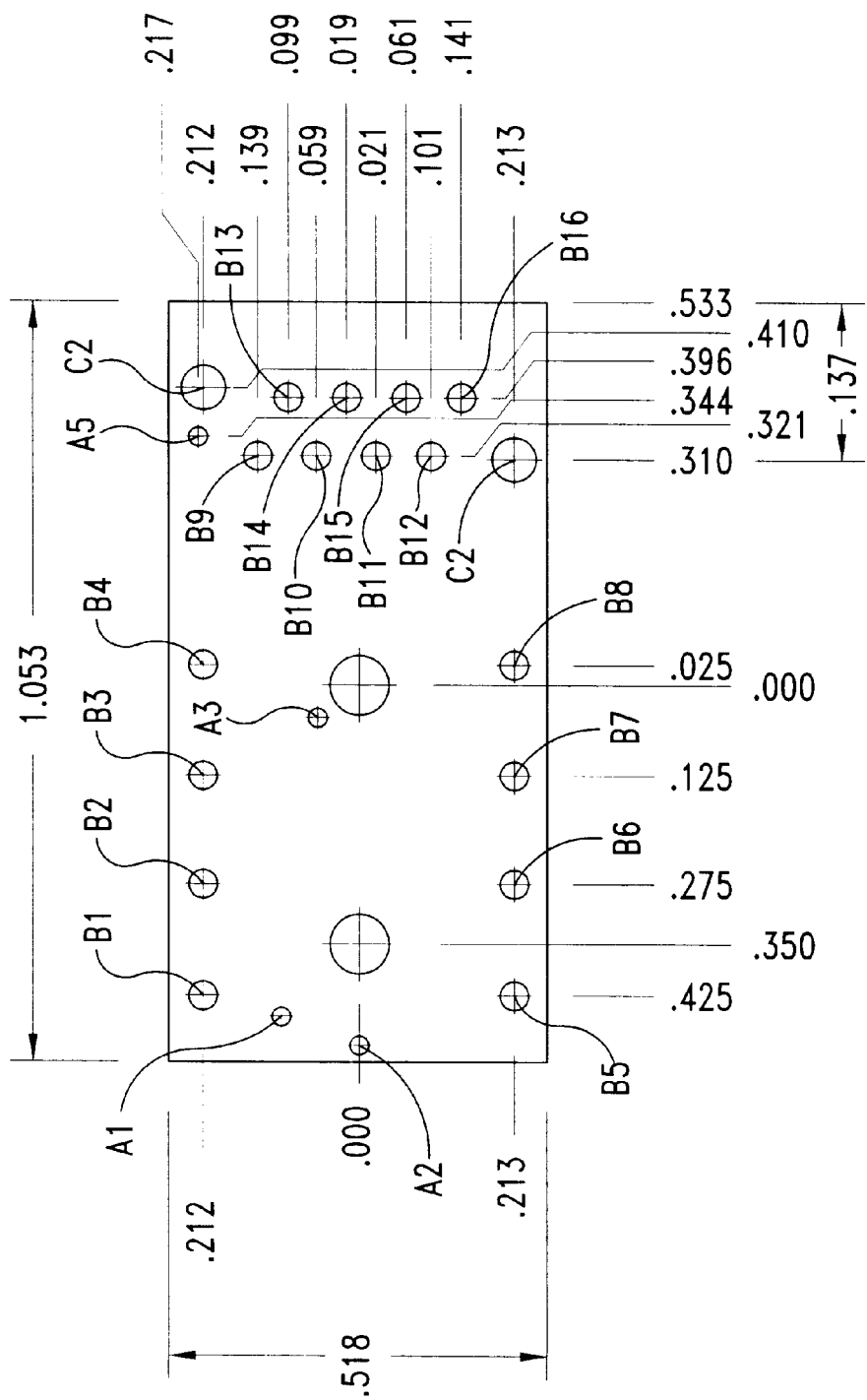
FIG. 17 is schematic diagram showing dimensions of hole placement corresponding to the pad layout corresponding to the first through fourth wire trace layers of FIGS. 12–15.

Portions of the wire traces of the second and third wire trace layers 156 and 160 are shown overlaid in FIG. 16 to the extent of inductive coupling found with this embodiment. Inductive coupling is added to reduce unwanted crosstalk originating between pair 1 of the center "tip" wire 30a and the center "ring" wire 30b and pair 3 of the split "tip" wire 34a and the center "ring" wire 34b. This added inductive coupling is between the pair of the "tip" and "ring" wire traces 130a and 130b found on the second wire trace layer 156 and the pair of the "tip" and "ring" wire traces 134a and 134b found on the third wire trace layer 160. The separation distance between the "tip" and "ring" wire traces 130a and 130b is somewhat greater than the separation distance between the "tip" and "ring" wire traces 134a and 134b. The direction of current for the pair of the "tip" and "ring" wire traces 130a and 130b is the same as the direction of current for the pair of "tip" and "ring" wire traces 134a and 134b. As shown in Table 5 below, the measured polarity of the inductive compensative coupling between pairs 1 and 3 is negative. Hole dimensions and placement for the wire connector pads 170, contact member pads 172, and internal contact pads 174 for the first, second, third, and fourth wire trace layers 150, 156, 160, and 166 are shown in FIG. 17.

TABLE 5

| Pairs Nos. | 2nd Layer Pair | 3rd Layer Pair | Inductive Coupling Polarity/NanoHenries |
|---|---|---|---|
| 1, 2 | 1 | 2 | Small |
| 1, 3 | 1 | 3 | Negative/1.0 |

Figure 18B:
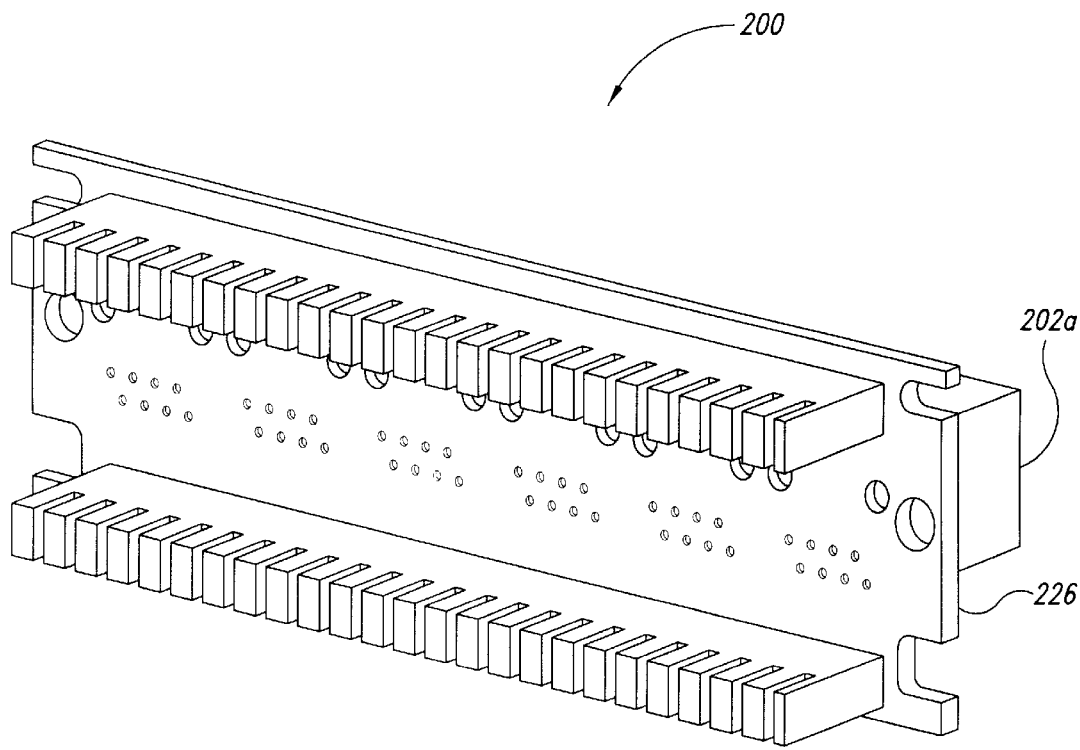
FIGS. 18A and 18B are front and rear isometric views of a multiple compensating jack connector embodiment of the present invention.
Figure 18A:
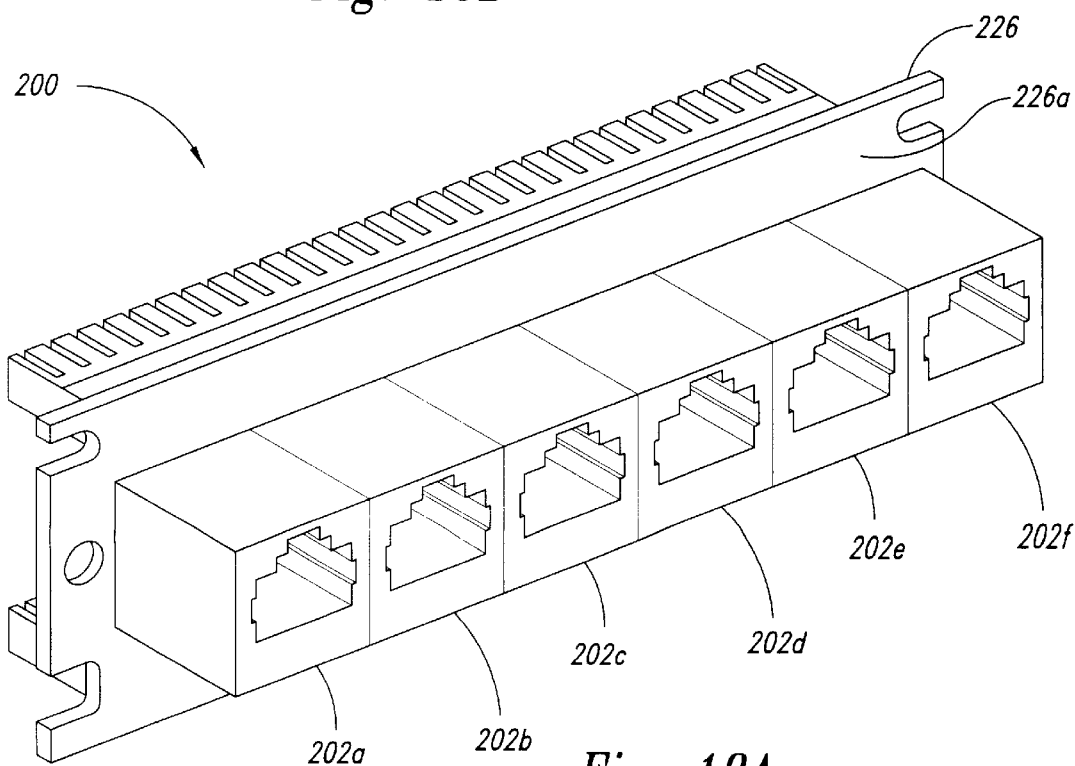
Figure 19:
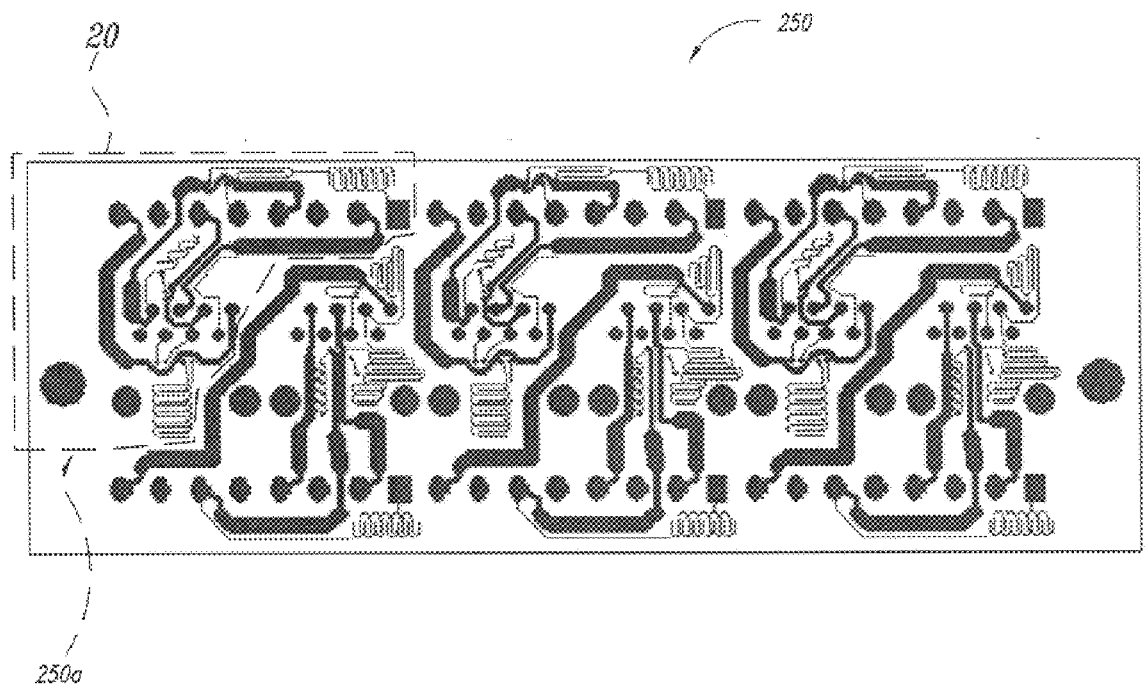
FIGS. 19 and 20 are schematic diagrams showing first and second wire trace layers, respectively, of a PC board for the multiple compensating jack connector of FIGS. 18A and 18B.
Figure 20:
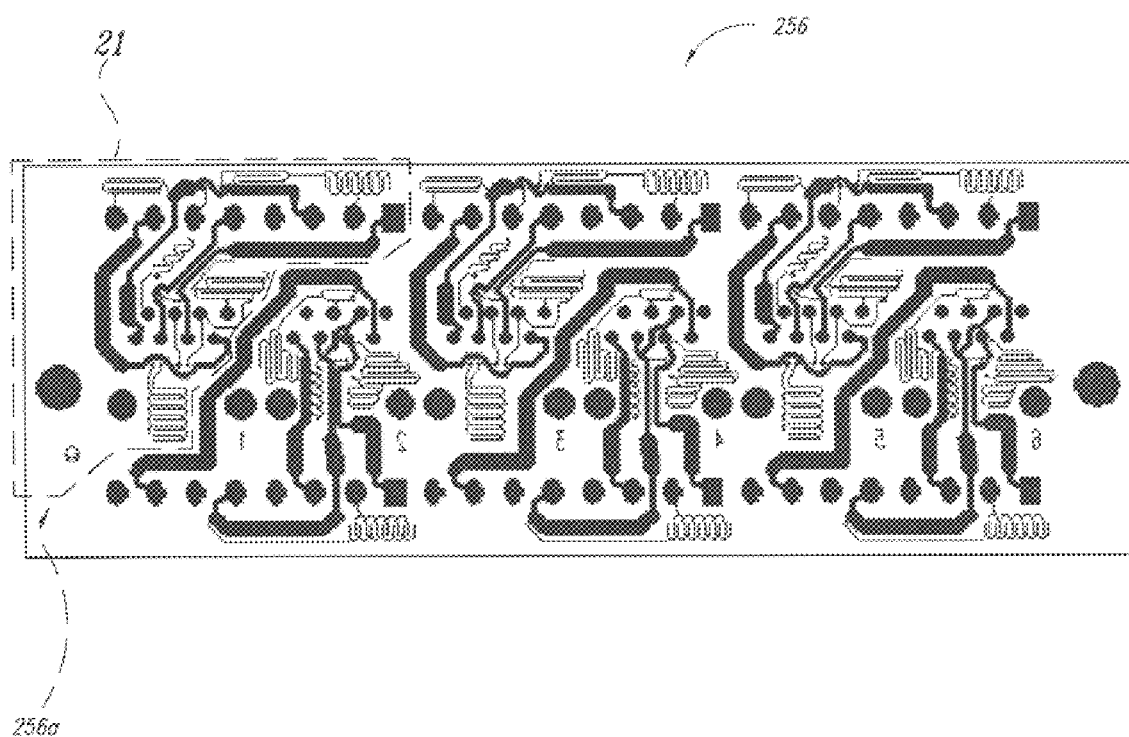
Figure 21:
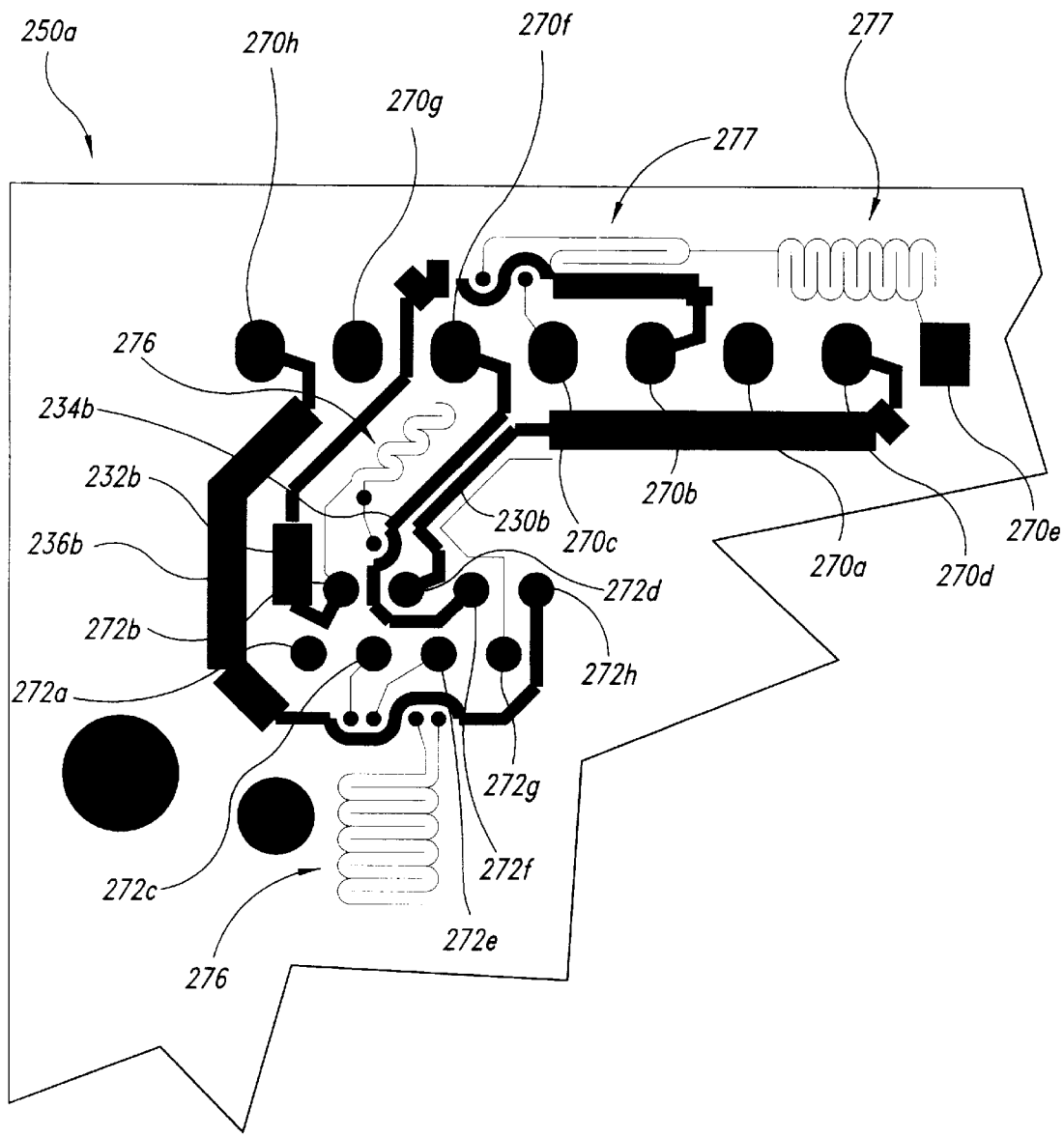
FIGS. 21 and 22 are schematic diagrams showing portions of the first and second wire trace layers of FIGS. 19 and 20, respectively.
Figure 22:
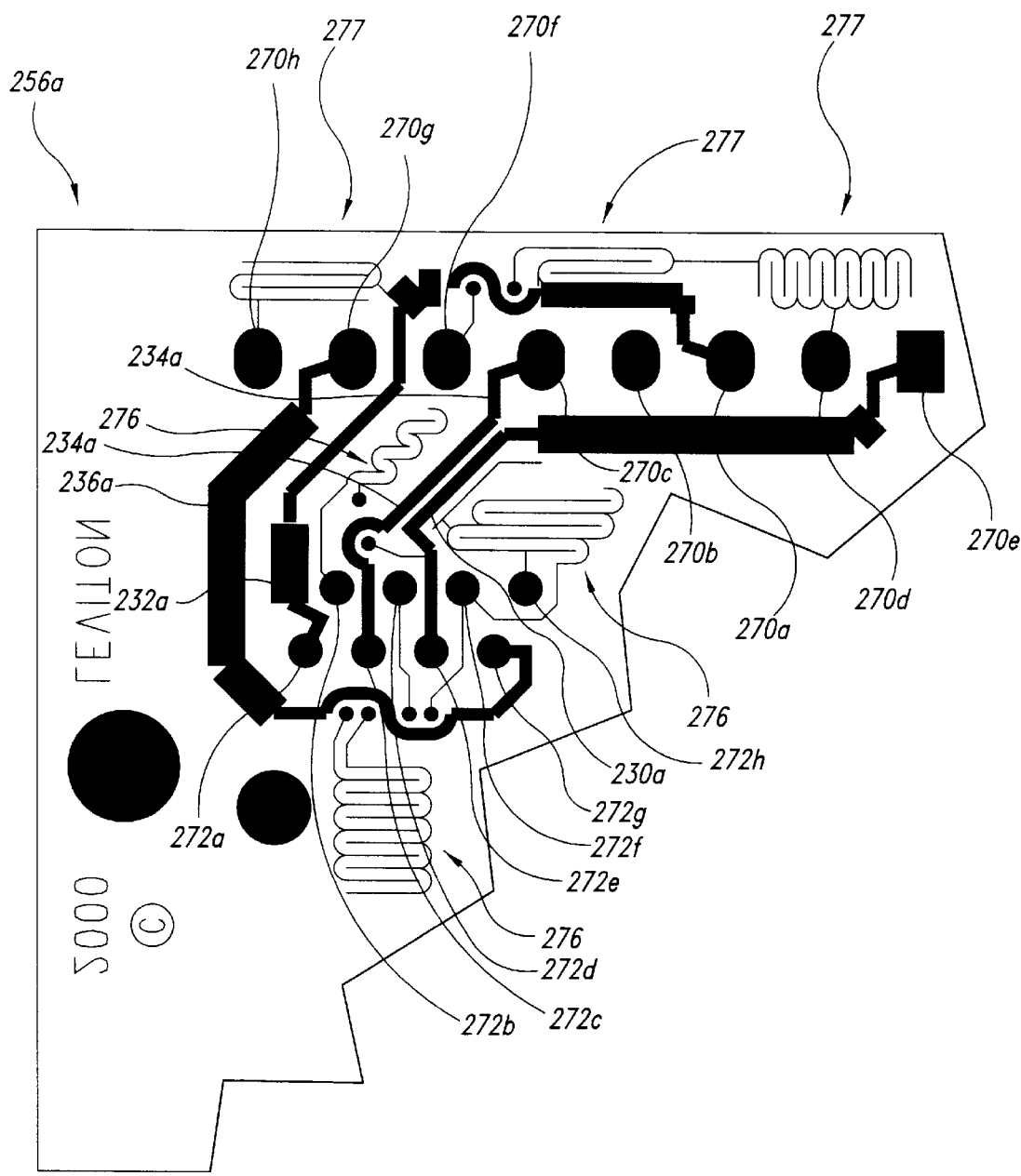
Figure 23:
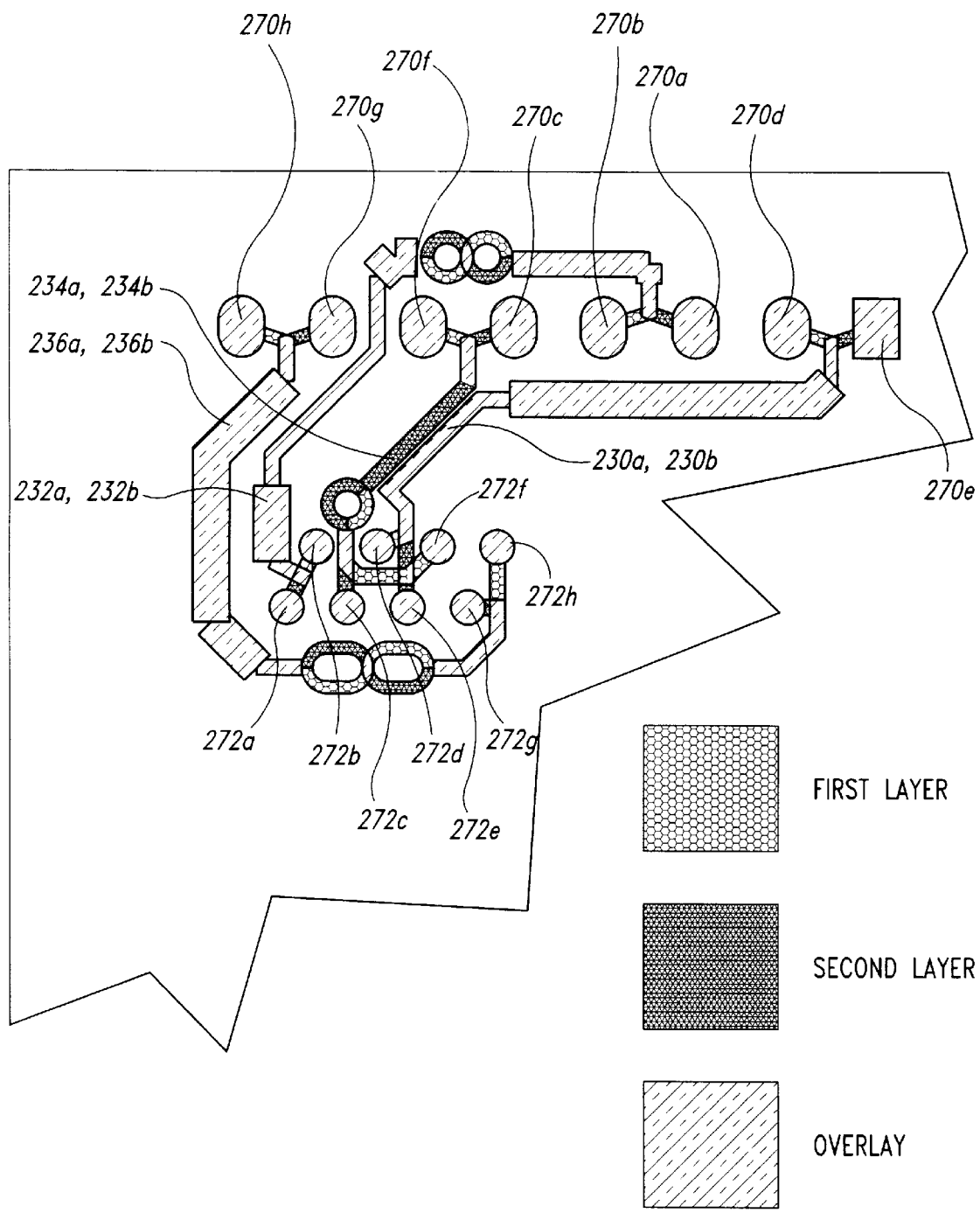
FIG. 23 is schematic diagram showing an overlay of the portions of the first and second wire trace layers of FIGS. 21 and 22.

The second depicted embodiment of inductive/multi-point compensative coupling is found in a multi-jack PC board 226 shown in FIGS. 18A and 18B as incorporated into a fully assembled multiple compensating jack connector 200 having plugs 202a–202f. The multi-jack PC board 226 has only a first wire trace layer 250 shown in FIG. 19 and a second wire trace layer 256 shown in FIG. 20. A first layer section 250a of the first wire trace layer 250 and a second layer section 256a of the second wire trace layer 256 associated with the plug 202a are shown in FIGS. 21 and 22. FIG. 23 provides an overlay view of the wire traces without inter-digitated capacitances.

The first and second layer sections 250a and 256a have wire connector pads 270a–270h coupled to wire connectors (not shown) in a manner similar how the wire connector pads 170a–170h are coupled to the wire connectors 116a–116h described above. The first and second layer sections 250a and 256a have contact member pads 272a–272h coupled to contact members (not shown) in a manner similar to how the contact member pads 172a–172h are coupled to the contact members 114a–114 described above. The wire connector pads 270 and the member pads 272 are coupled with the pairs 1–4 of "tip" and "ring" wires as follows. The pair 1 of the center "tip" wire 30a is coupled to the wire connector 270e and the contact member pad 272e, and of the center "ring" wire 30b is coupled to the wire connector 270d and the contact member pad 272d. The pair 2 of the left outside "tip" wire 32a is coupled to the wire connector pad 270a and the contact member pad 272a, and of the left outside "ring" wire 32b is coupled to the wire connector pad 270b and the contact member pad 272b. The pair 3 of the split "tip" wire 34a is coupled to the wire connector pad 270c and the contact member pad 272c, and of the split "ring" wire 34b is coupled to the wire connector pad 270f and the contact member pad 272f. The pair 4 of the right outside "tip" wire 36a is connected to the wire connector pad 270g and the contact member pad 272g, and of the outside "ring" wire 36b is connected to the wire connector pad 270h and the contact member pad 272h.

Multi-point capacitive compensation is provided by inter-digitated capacitance 277 coupled to some of the wire connector pads 270 as shown in FIG. 21 and some portions of inter-digitated capacitance 276 coupled to some of the contact member pads 272. Other compensative capacitive coupling is provided by remaining portions of the inter-digitated capacitance 276 coupled to some of the contact member pads 272.

Inductive compensative coupling is provided between pair 1 and pair 3 by a parallel "ring" run of "ring" wire trace 234b with "ring" wire trace 230b on the first layer section 250a and a parallel "tip" run of "tip" wire trace 234a with "tip" wire trace 230a on the second layer section 256a. The parallel "ring" run and parallel "tip" run are overlaid in a manner similar to that described for FIG. 4B above. Measured capacitive coupling for the first and second layer sections 250a and 256a are summarized in Table 6 below. Measured inductive coupling was 2.0 nanoHenries between pair 1 and pair 3 having a positive polarity.

TABLE 6

| Pair Nos. | Pin Nos. Used | Capacitive Coupling picoFarads |
| --- | --- | --- |
| 1, 2 | 1–4 | −1.0 (capacitance 276) |
| 1, 3 | 4–6, 3–5 | +1.35, +1.35 (capacitance 276) |
| 1, 3 | 5–6, 3–4 | −0.8, −0.8 (capacitance 277) |
| 1, 4 | 4–7, 5–8 | −0.4, −0.4 (capacitance 277) |
| 2, 3 | 2–6, 1–3 | +0.3, +0.3 (capacitance 276) |
| 2, 4 | | |
| 3, 4 | 6–8 | +0.9 (capacitance 276) |

It should also be noted that the compensating jack connector 100 can be made in a wall mount version and other versions including those that are free-standing. The principles of the present invention are intended to encompass all such variations of communication connectors. In addition, the present invention is intended to encompass communication connectors other than the RJ45 style, and may include a greater or lesser number of twisted pair cables. Thus, the present invention set forth in some of the accompanying exemplary embodiments above reduces crosstalk by adding inductive coupling or multi-point compensative coupling and some other embodiments above add multi-point compensative coupling along with inductive coupling to compensate for crosstalk originating by at least one of capacitive and inductive coupling.

It is to be understood that even though various embodiments and advantages of the present invention have been set forth in the foregoing description, the above disclosure is illustrative only, and changes may be made in detail, yet remain within the broad principles of the invention. Therefore, the present invention is to be limited only by the appended claims.

What is claimed is:

1. A compensating jack connector configured to be electrically coupled to a plug connector having plug connector elements, the plug connector configured to be electrically coupled to a first set of external conductors, the compensating jack connector configured to be electrically coupled to a second set of external conductors, the compensating jack connector comprising:

a body having a first body portion and a second body portion, the first body portion being configured to engage the compensating jack connector with the plug connector;

a plurality of contact members positioned toward the first body portion, the contact members configured to be electrically coupled with the plug connector elements when the compensating jack connector is engaged with the plug connector;

a plurality of wire connectors positioned toward the second body portion, the wire connectors configured to be electrically coupled to the second set of external conductors;

a structure with first and second surfaces; and a plurality of internal conductors including first, second, third, and fourth conductors, at least part of the first and second conductors being adjacent the first surface, at least part of the third and fourth conductors being adjacent the second surface, each of the plurality of internal conductors being electrically coupled to one of the plurality of contact members, each of the plurality of internal conductors extending toward one of the plurality of wire connectors, each of the plurality of internal conductors being electrically coupled to one of the plurality of wire connectors, a first portion of the first conductor and a first portion of the second conductor being spaced apart from a first centerline, a first portion of the third conductor and a first portion of the fourth conductor being spaced apart from a second centerline, the first centerline and the second centerline being in alignment with one another whereby inductive coupling occurs when communication signals are applied to the first, second, third, and fourth conductors wherein inductive coupling between the first, second, third, and fourth conductors has an inductance value of at least 0.4 nanoHenries.

2. The compensating jack connector of claim 1 wherein the first portion of the first conductor and the first portion of the second conductor are spaced apart from the first centerline in parallel alignment.

3. The compensating jack connector of claim 1 wherein the first portion of the first conductor and the first portion of the second conductor are spaced apart from the first centerline a first distance and the first portion of the third conductor and the first portion of the fourth conductor are spaced apart from the second centerline a second distance.

4. The compensating jack connector of claim 3 wherein the first distance is equal to the second distance.

5. The compensating jack connector of claim 3 wherein the first distance is less than the second distance.

6. The compensating jack connector of claim 3 wherein the first distance varies.

7. The compensating jack connector of claim 1 wherein the first conductor is a tip conductor and the second conductor is a ring conductor.

8. The compensating jack connector of claim 7 wherein the third conductor is a tip conductor and the second conductor is a ring conductor.

9. The compensating jack connector of claim 1 wherein the first conductor is a tip conductor and the second conductor is a tip conductor.

10. The compensating jack connector of claim 9 wherein the third conductor is a ring tip conductor and the fourth conductor is a ring conductor.

11. The compensating jack connector of claim 1 wherein in a first area of the first surface and a first area of the second surface where the first centerline and the second centerline are in alignment with one another, the first conductor and the second conductor each extend toward one of the plurality of contact members and the third conductor and fourth conductor each extend toward one of the plurality of contact members.

12. The compensating jack connector of claim 1 wherein in a first area of the first surface and a first area of the second surface where the first centerline and the second centerline are in alignment with one another, the first conductor and the second conductor each extend toward one of the plurality of contact members and the third conductor and fourth conductor each extend toward one of the plurality of wire connectors.

13. The compensating jack connector of claim 1 wherein the first conductor and the second conductor are electrically coupled to the center pair of the second set of external conductors and the third conductor and the fourth conductor are electrically coupled to the split pair of the second set of external conductors.

14. The compensating jack connector of claim 1 wherein the first surface and the second surface are surfaces of a single dielectric material.

15. The compensating jack connector of claim 1 wherein the first body portion is configured to engaged with the plug connector as an RJ45 jack connector.

16. The compensating jack connector of claim 1 wherein the plurality of internal conductors further including additional internal conductors.

17. The compensating jack conductor of claim 1 wherein the first conductor has a first width, the second conductor has a second width, the third conductor has a third width, and the fourth conductor has a fourth width, and wherein the first conductor is spaced from the first centerline no more than twice the first width, the second conductor is spaced from the first centerline no more than twice the second width, the third conductor is spaced from the second centerline no more than twice the third width, and the fourth conductor is spaced from the second centerline no more than twice the fourth width.

18. The compensating jack conductor of claim 1 wherein the first conductor extends a first length between one of the plurality of wire connectors and one of the plurality of contact members, the second conductor extends a second length between one of the plurality of wire connectors and one of the plurality of contact members, the third conductor extends a third length between one of the plurality of wire connectors and one of the plurality of contact members, the fourth conductor extends a fourth length between one of the plurality of wire connectors and one of the plurality of contact members, and wherein the first portion of the first conductor is at least one tenth of the first length, the first portion of the second conductor is at least one tenth of the second length, the first portion of the third conductor is at least one tenth of the third length, and the first portion of the fourth conductor is at least one tenth of the fourth length.

19. The compensating jack connector of claim 1, further including inter-digitated capacitance electrically coupled between two of the contact members toward the first body portion and inter-digitated capacitance electrically coupled between two of the wire connectors toward the second body portion.

20. The compensating jack connector of claim 1, further including inter-digitated capacitance electrically coupled between two of the contact members toward the first body portion.

21. The compensating jack connector of claim 1 wherein the plurality of internal conductors are wire traces on a printed circuit board.

22. A compensating connector configured to electrically couple to a mating connector, the mating connector configured to be electrically coupled to a set of external conductors, the mating connector configured to pass communication signals and unwanted crosstalk signals to the electrically coupled compensating connector, the compensating connector comprising:

a body having a first body portion being configured to engage the compensating connector with the mating connector;

a plurality of internal conductors including first, second, third, and fourth conductors, a first portion of the first conductor and a first portion of the second conductor being spaced apart according to a first relation to produce a first magnetic field when the communication signals are passed from the mating connector to the compensating connector, a first portion of the third conductor and a first portion of a fourth conductor being spaced apart according to a second relation to from a second magnetic field when the communication signals are passed from the mating connector to the compensating connector, the first portions of the first and second conductors being positioned with respect to the first portions of the third and fourth conductors to couple the first and second magnetic fields to form a tailored inductive coupling, the tailored inductive coupling configured to reduce the unwanted crosstalk signals.

23. A compensating jack connector configured to electrically couple to a plug connector having plug connector elements, the plug connector configured to be electrically coupled to a first set of external conductors, the compensating jack connector configured to be electrically coupled to a second set of external conductors, the compensating jack connector comprising:

a body having first body portion and a second body portion, the first body portion being configured to engage the compensating jack connector with the plug connector;

a plurality of contact members positioned toward the first body portion, the contact members configured to electrically couple with the plug connector elements when the compensating jack connector is engaged with the plug connector;

a plurality of wire connectors positioned toward the second body portion, the wire connectors configured to electrically coupled to the second set of external conductors;

a structure with first and second surfaces; and a plurality of internal conductors including first and second pairs of conductors, at least part of the first pair of conductors being adjacent the first surface, at least part of the second pair of conductors being adjacent the second surface, each of the plurality of internal conductors being electrically coupled to one of the plurality of contact members, each of the plurality of internal conductors extending toward one of the plurality of wire connectors, each of the plurality of internal conductors being electrically coupled to one of the plurality of wire connectors, a first portion of the first pair of conductors extending coextensively and a first portion of the second pair of conductors extending coextensively, the first portion of the first pair of conductors and the first portion of the second pair of conductors being positioned in opposing relation to induce induction to compensate for cross-talk originating outside of the compensating connector.

24. In a communication connector, a method of adding compensative inductive coupling, the method comprising:

extending a first conductor from a first area of the communication connector to a second area of the communication connector;

extending a second conductor from the first area of the communication connector to the second area of the communication connector to so position a first portion of the second conductor with respect to a first portion of the first conductor to produce a first magnetic field when the first and second conductors carry a communication signal;

extending a third conductor from the first area of the communication connector to the second area of the communication connector;

extending a fourth conductor from the first area of the communication connector to the second area of the communication connector to so position a first portion of the fourth conductor with respect to a first portion of the third conductor to produce a second magnetic field when the third and fourth conductors carry a communication signal;

positioning the first portions of the first and second conductors with respect to the first portions of the third and fourth conductors to couple the first and second magnetic fields to produce an inductive coupling to contribute in reducing unwanted cross-talk originating outside the communication connector.

25. A compensating jack connector configured to electrically couple to a plug connector having plug connector elements, the plug connector configured to be electrically coupled to a first set of external conductors, the compensating jack connector configured to be electrically coupled to a second set of external conductors, the compensating jack connector comprising:

a body having first body portion and a second body portion, the first body portion being configured to engage the compensating jack connector with the plug connector;

a plurality of contact members positioned toward the first body portion, the contact members configured to electrically couple with the plug connector elements when the compensating jack connector is engaged with the plug connector;

a plurality of wire connectors positioned toward the second body portion, the wire connectors configured to electrically coupled to the second set of external conductors;

a structure with first and second surfaces; and a plurality of internal conductors including first and second pairs of conductors, at least part of the first pair of conductors being adjacent the first surface, at least part of the second pair of conductors being adjacent the second surface, each of the plurality of internal conductors being electrically coupled to one of the plurality of contact members, each of the plurality of internal conductors extending toward one of the plurality of wire connectors, each of the plurality of internal conductors being electrically coupled to one of the plurality of wire connectors, a first portion of the first pair of conductors extending coextensively for a first length and a first portion of the second pair of conductors extending coextensively for a second length, the first portion of the first pair of conductors and the first portion of the second pair of conductors being positioned in opposing relation for a third length, the third length being at least 50% of the first length and at least 50% of the second length.

* * * * *

UNITED STATES PATENT AND TRADEMARK OFFICE
CERTIFICATE OF CORRECTION

PATENT NO.         : 6,379,157 B1  
APPLICATION NO.    : 09/642114  
DATED              : April 30, 2002  
INVENTOR(S)        : Cliff R. Curry and John M. Redfield It is certified that error appears in the above-identified patent and that said Letters Patent is hereby corrected as shown below:

<u>Title page,</u>  
Item [75], Inventors, add -- Gavrik Peterson --.

<u>Column 26,</u>  
Lines 12-13, "to from" should be -- to form --.

Signed and Sealed this

Twenty-seventh Day of June, 2006

JON W. DUDAS  
*Director of the United States Patent and Trademark Office*